(12) United States Patent
Ewert et al.

(10) Patent No.: US 8,507,376 B2
(45) Date of Patent: Aug. 13, 2013

(54) METHOD TO FORM SOLDER DEPOSITS ON SUBSTRATES

(75) Inventors: Ingo Ewert, Berlin (DE); Sven Lamprecht, Berlin (DE); Kai-Jens Matejat, Berlin (DE); Thomas Pliet, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 294 days.

(21) Appl. No.: 13/121,471

(22) PCT Filed: Oct. 7, 2009

(86) PCT No.: PCT/EP2009/063049
§ 371 (c)(1),
(2), (4) Date: Mar. 29, 2011

(87) PCT Pub. No.: WO2010/046235
PCT Pub. Date: Apr. 29, 2010

(65) Prior Publication Data
US 2011/0189848 A1    Aug. 4, 2011

(30) Foreign Application Priority Data

Oct. 21, 2008 (EP) .................................. 08167159
Apr. 24, 2009 (EP) .................................. 09158715
Apr. 24, 2009 (EP) .................................. 09158725

(51) Int. Cl.
*H01L 21/00* (2006.01)
(52) U.S. Cl.
USPC ........................................ 438/614; 438/678
(58) Field of Classification Search
USPC ........................................ 438/612–616, 678
See application file for complete search history.

(56) References Cited

U.S. PATENT DOCUMENTS

| 4,582,576 A | 4/1986 | Opaskar et al. |
| 2006/0219567 A1 | 10/2006 | Hu |
| 2007/0186412 A1 | 8/2007 | Hsu et al. |

FOREIGN PATENT DOCUMENTS

| EP | 0971570 | 1/2000 |
| EP | 1029947 | 8/2000 |
| EP | 1322146 | 6/2003 |

OTHER PUBLICATIONS

PCT/EP2009/063049; PCT International Search Report mailed Feb. 25, 2010.
Dr. Manfred Jordan; The Electrodeposition of Tin and its Alloys; Eugen G. Leuze Publishers, 1995.
Prof. Dr. Ing. Werner Jillek et al.; Handbuch der Leiterplattentechnik; Eugen G. Leuze Publishers, 2003.

*Primary Examiner* — Richard Booth
(74) *Attorney, Agent, or Firm* — Renner, Otto, Boisselle & Sklar, LLP

(57) ABSTRACT

Described is a method of forming a solder deposit on a substrate comprising the following steps i) provide a substrate including a surface bearing electrical circuitry that includes at least one contact area, ii) form a solder mask layer that is placed on the substrate surface and patterned to expose the at least one contact area, iii) contact the entire substrate area including the solder mask layer and the at least one contact area with a solution suitable to provide a conductive layer on the substrate surface, iv) electroplate a solder deposit layer containing a tin or tin alloy onto the conductive layer and v) etch away an amount of the solder deposit layer containing tin or tin alloy sufficient to remove the solder deposit layer from the solder mask layer area leaving a solder material layer on the at least one contact area.

18 Claims, 19 Drawing Sheets

FIG.1 Solder mask defined pad / planarized

FIG.2 Non-solder mask defined pad / planarized

FIG.3 Solder mask defined pad with non-filled BMV / planarized

FIG.4 Non-solder mask defined pad with non-filled BMV / planarized

FIG.5 Solder mask defined pad / individual heights

FIG.6 Non solder mask defined pad / individual heights

FIG.7 Solder mask defined pad with non-filled BMV / individual heights

FIG.8 Non-solder mask defined pad with non-filled BMV / individual heights

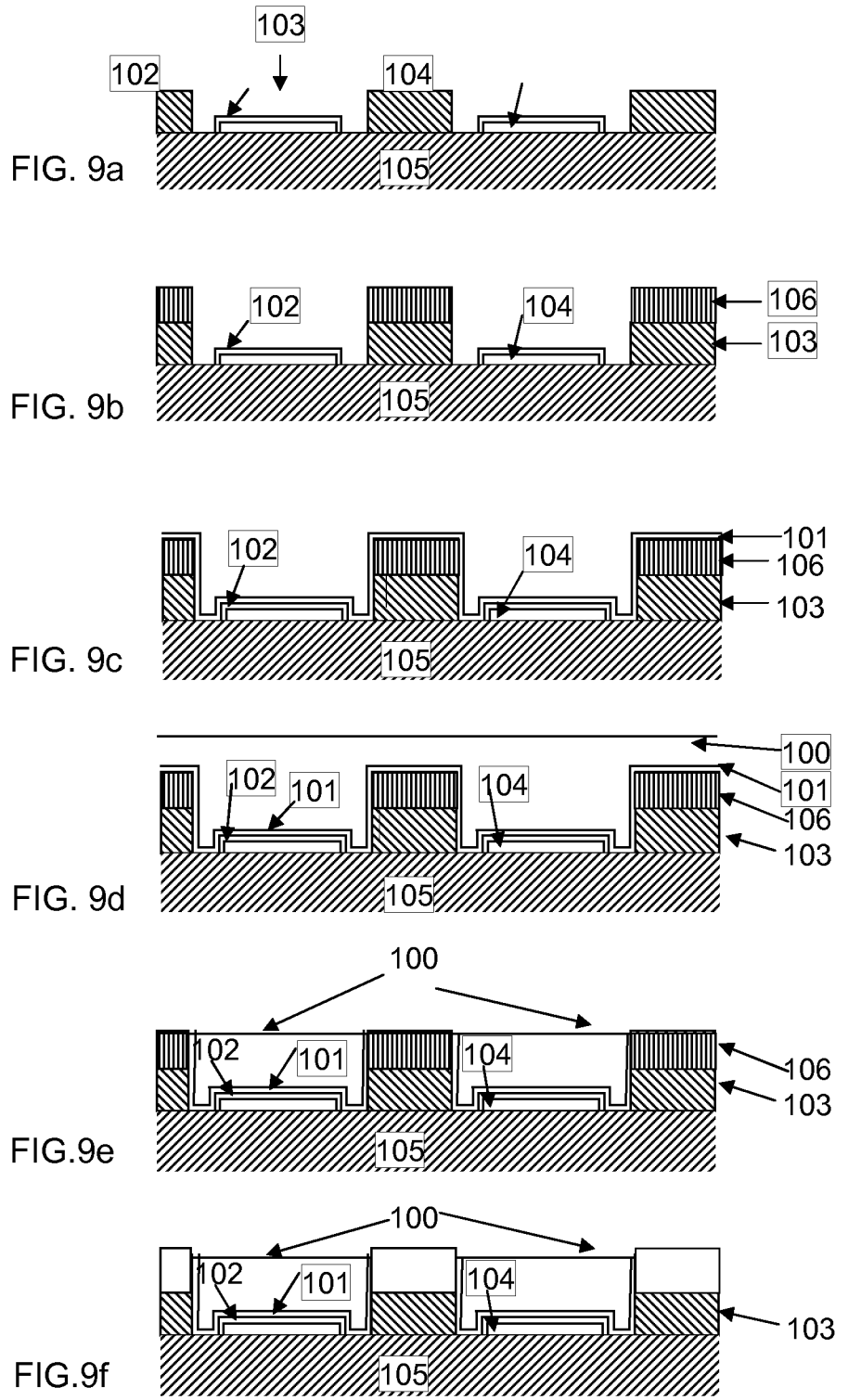
FIG. 9 Non-solder mask defined pad / individual height

FIG.10 Joining of a planar structures and one with additional solder volume
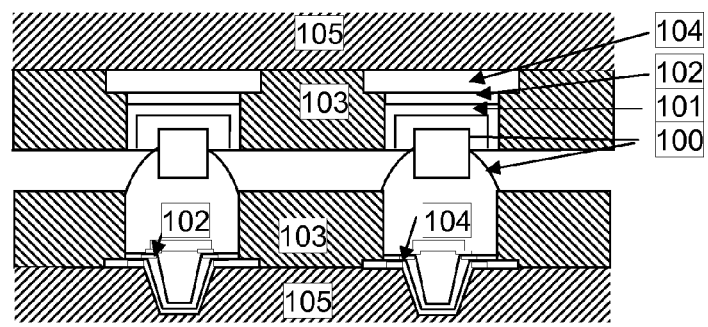
FIG.11 Joining of a planar structures with a pre-balled structure
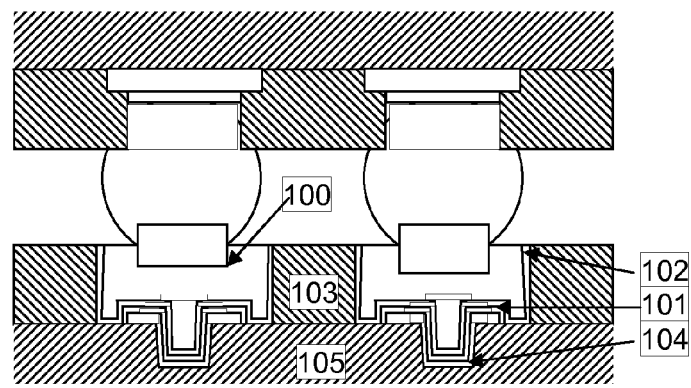

FIG 12: Solder mask defined pad with blind micro via (BMV)

FIG 13: Solder mask defined pad with blind micro via

FIG 14: Solder mask defined pad with blind micro via

FIG 15: Solder mask defined pad with stacked blind micro via

METHOD TO FORM SOLDER DEPOSITS ON SUBSTRATES

FIELD OF THE DISCLOSURE

The invention relates to the formation of solder depots by electroplating, particularly to flip chip packages, more particularly to flip chip joints and board to board solder joints formed by electroplated solder of tin and tin alloys.

BACKGROUND OF THE INVENTION

Since the introduction of the flip chip technology by IBM in the early 1960s, the flip chip devices have been mounted on an expensive ceramic substrate where the thermal expansion mismatch between the silicon chip and the ceramic substrate is less critical. In comparison with wire bonding technology, the flip chip technology is better able to offer higher packaging density (lower device profile) and higher electrical performance (shorter possible leads and lower inductance). On this basis, the flip chip technology has been industrially practiced for the past 40 years using high-temperature solder (controlled-collapse chip connection, C4) on ceramic substrates. However, in recent years, driven by the demand of high-density, high-speed and low-cost semiconductor devices for the trend of miniaturization of modern electronic products, the flip chip devices mounted on a low-cost organic circuit board (e.g. printed circuit board or substrate) with an epoxy underfill to mitigate the thermal stress induced by the thermal expansion mismatch between the silicon chip and organic board structure have experienced an obviously explosive growth. This notable advent of low-temperature flip chip joints and organic-based circuit board has enabled the current industry to obtain inexpensive solutions for fabrication of flip chip devices.

In the current low-cost flip chip technology, the top surface of the semiconductor integrated circuit (IC) chip has an array of electrical contact pads. The organic circuit board has also a corresponding grid of contacts. The low-temperature solder bumps or other conductive adhesive material are placed and properly aligned in between the chip and circuit board. The chip is flipped upside down and mounted on the circuit board, in which the solder bumps or conductive adhesive material provide electrical input/output (I/O) and mechanical interconnects between the chip and circuit board. For solder bump joints, an organic underfill encapsulant may be further dispensed into the gap between the chip and circuit board to constrain the thermal mismatch and lower the stress on the solder joints.

In general, for achieving a flip chip assembly by solder joints, the metal bumps, such as solder bumps, gold bumps or copper bumps, are commonly pre-formed on the pad electrode surface of the chip, in which the bumps can be any shape, such as stud bumps, ball bumps, columnar bumps, or others. The corresponding solder bumps (or say presolder bumps), typically using a low-temperature solder, are also formed on the contact areas of the circuit board. At a reflow temperature, the chip is bonded to the circuit board by means of the solder joints. After dispensing of an underfill encapsulant, the flip chip device is thus constructed. Such methods are well known in the art and typical examples of the flip chip devices using solder joints are for example described in U.S. Pat. No. 7,098,126 (H.-K. Hsieh et al.).

Currently, the most common method for formation of presolder bumps on the circuit board is the stencil printing method. Some prior proposals in relation to the stencil printing method can be referred to U.S. Pat. No. 5,203,075 (C. G. Angulas et al.), U.S. Pat. No. 5,492,266 (K. G. Hoebener et al.) and U.S. Pat. No. 5,828,128 (Y. Higashiguchi et al.). Solder bumping technique for flip chip assemblies requires design considerations regarding both bump pitch and size miniaturization. According to practical experiences, the stencil printing will become infeasible once the bump pitch is decreased below 0.15 millimeter. In contrast, the solder bumps deposited by electroplating offer the ability to further reduce bump pitch down to below 0.15 millimeter. The prior proposals in relation to electroplate bumps on the circuit board for flip chip bonding can be found in U.S. Pat. No. 5,391,514 (T. P. Gall et al.) and U.S. Pat. No. 5,480,835 (K. G. Hoebener et al.). Although eletroplate solder bumping on the circuit board offers finer bump pitch over stencil printing, it presents several challenges for initial implementation.

A multi-step process to form solder on an organic substrate is described in U.S. Pat. No. 7,098,126 (H.-K. Hsieh et al.). In the method, there is initially provided an organic circuit board including a surface bearing electrical circuitry that includes at least one contact area. A solder mask layer that is placed on the board surface and patterned to expose the pad. Subsequently, a metal seed layer is deposited by physical vapor deposition, chemical vapor deposition, electroless plating with the use of catalytic copper, or electroplating with the use of catalytic copper, over the board surface. A resist layer with at least an opening located at the pad is formed over the metal seed layer. A solder material is then formed in the opening by electroplating. Finally, the resist and the metal seed layer beneath the resist are removed. To apply this method various patterning steps are required which is not desired from the overall standpoint of process efficiency. Furthermore the method has its limitations if the distance between adjacent contact areas (pitch) is very small as a result of the miniaturization of electronic devices.

A fabrication method of conductive bump structures of circuit boards is disclosed in US 2006/0219567 A1. A solder material is electroplated onto the substrate which is partially protected by a solder mask followed by deposition of an etch resist onto the layer of solder material which is then patterned in a way that the solder material coated connecting pads are protected during the following etching step. Solder material which is not needed for the solder depots is then etched away leaving only the etch resist protected solder depot above the connecting pads.

Accordingly, it is the aim of the present invention to provide a method for forming solder deposits on substrates like circuit boards, which involves a reduced number of process steps. Furthermore, it is the aim to offer a plating method yielding solder material of high uniformity which is suitable to form solder deposits on very fine structures also.

SUMMARY OF THE DISCLOSURE

It is therefore an objective of the present invention to adopt an electroplating method of tin and tin alloys to produce a uniform layer of a solder deposit on a substrate. Such baths should be suitable to fill recess structures possessing high aspect ratios without leaving voids or dimples.

Another object of the present invention is to provide a method for solder deposition having a reduced number of plating steps and which is universally applicable even when the solder resist openings have different dimensions.

Another objective of the present invention is to provide a method to form a metal seed layer on a non-conductive substrate, e.g. a printed circuit, which is used to produce electroplate solder for forming flip chip joints and board to board solder joints.

In summary, a method of fabricating electroplate solder deposits on a substrate for forming flip chip joints and board to board solder joints is disclosed. According to the present invention, there is provided a non-conductive substrate like a circuit board including a surface bearing electrical circuitry which includes at least one contact area. Such contact area can be any conductive surface area, e.g. a contact pad or the topmost area of a circuitry facing outside the substrate.

After applying a solder mask on part of the surface of the substrate a conductive seed layer is formed on the entire surface area. Optionally, prior to the deposition of the seed layer the solder mask layer can be enhanced in height by an additional non-conductive layer, e.g. a resist. This results in an increased volume of the subsequently plated solder deposit. A solder material layer containing a tin or tin alloy onto the conductive layer is then plated on the conductive areas of the substrate to form a solder deposit. Thereafter, excess solder material is etched away in an amount sufficient to remove the solder material from the solder mask layer area leaving a solder deposit on the at least one contact area to form a solder depot. Also removed, preferably in the same process step, is the conductive seed layer from the solder mask layer area.

Another objective of the present invention is to provide a method of fabricating electroplate solder deposits on a substrate for forming flip chip solder joints and board to board solder joints whereon optionally an electrical circuitry is formed by a print and etch process.

Optionally, an additional layer of a metal or metal alloy is deposited onto the solder deposit after excess solder material is etched away. Said additional layer of a metal forms a solder alloy with the electroplated solder deposit layer during reflow.

BRIEF DESCRIPTION OF THE DRAWINGS

FIGS. 9(a)-9(f) shows a method to obtain a non-solder mask defined pad with individual heights of the electroplated solder material layer applying an additional resist to increase the volume of the solder deposit.

FIG. 10 shows joining of a planar structure according to the embodiment of FIG. 1 with an embodiment of FIG. 7 containing additional solder volume (solder bump).

FIG. 11 shows joining of a planar structure according to the embodiment of FIG. 1 with an embodiment of FIG. 4 containing additional solder volume having a pre-balled structure obtained by reflowing the solder (solder bump).

Figure 1A:
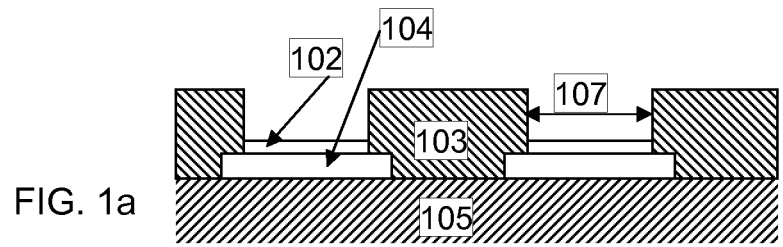
FIGS. 1(a)-1(d) shows a method to obtain a solder mask defined pad with a planarized electroplated solder material layer.

100 solder deposit layer
101 conductive seed layer
102 optional barrier layer
103 solder mask layer
104 outer layer contact pad
105 non-conductive substrate
106 etch resist
107 solder resist opening (SRO)
108 copper layer
109 photo resist layer
110 inner layer contact pad
111 opening, formed blind micro via (BMV)
112 conformal coated BMV
113 stacked BMV
114 inner layer pad with opening for BMV

DETAILED DESCRIPTION OF THE INVENTION

The invention provides a method of forming a solder deposit on a substrate by electroplating a tin or tin alloy layer. The process is particularly suitable for fabricating solder bumps on a circuit board, which is able to form solder bumps with good plating uniformity. The method is in more detail described below. The figures shown herein are simply illustrative of the process. The figures are not drawn to scale, i.e. they do not reflect the actual dimensions or features of the various layers in the chip package structure. Like numbers refer to like elements throughout the description.

Now referring to FIG. 1a, in accordance with a preferred embodiment of the present invention, there is provided a non-conductive substrate 105, which has contact pads 104 as a contact area embodiment on its surface. The non-conductive substrate 105 can be a circuit board which may be made of an organic material or a fiber-reinforced organic material or a particle-reinforced organic material, etc., for example, epoxy resin, polyimide, bismeleimide triazine, cyanate ester, polybenzocyclobutene, or glass fiber composite thereof, etc.

Said contact pad 104 is formed typically from a metal material, such as copper. Optionally, a barrier layer 102 is formed on the contact pads 104 and can e.g. be an adhesive layer of nickel or a protective layer of gold. Said barrier layer 102 may also be made of nickel, palladium, silver, tin, nickel/palladium, chromium/titanium, palladium/gold, or nickel/palladium/gold, etc., which can be made by electoplating, electroless plating, or physical vapor deposition, etc. A solder mask layer 103 is finally deposited on the surface of said non-conductive substrate 105 to protect the circuitry and provide insulation.

Figure 1B:
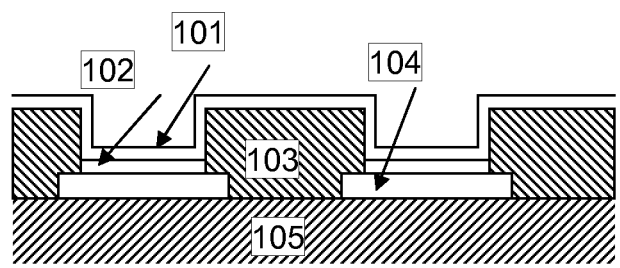

In order to fabricate a solder deposit containing a tin or tin alloy by electroplating on a non-conductive surface, a conductive seed layer formed on the non-conductive surface is required to initiate the electroplating. Such seed layer 101 is depicted in FIG. 1b. In general, the seed layer is for example formed by electroless deposition in the conventional manufacturing industry of non-conductive surfaces and well known in the art.

According to the present invention the conductive seed layer is deposited over the entire surface of the non-conductive substrate 105 including the contact pad area 104 and the solder mask area 103.

The seed metal layer is electrically conductive, provides adhesion, permits the exposed portions of its upper surface to be electroplated, and can prevent migration of the subsequent solder deposit metal to the underlying metal of the contact area. Alternatively, the seed metal layer may be composed of two metal layers. An example for the second metal is copper, since it provides a suitable surface for subsequent electroplating.

The non-conductive substrates can be activated by various methods which are described, for example, in Handbuch der Leiterplattentechnik, Vol. 4, 2003, pages 292 to 300. These processes involve the formation of a conductive layer comprising carbon particles, Pd colloids or conductive polymers. Processes involving the use of carbon particles have been developed by the company "Electrochemicals" and are marketed, for example, under the trade name "Shadow".

Another process is known in the art as the "black hole" process which has been developed by the company MacDermid. Processes involving the use of palladium colloids have been developed by the companies Shipley Ronal and Atotech and are known, for example, under the trade names "Crimson", "Conductron" and "Neopact", respectively.

Processes involving the use of conductive polymers have been developed by the companies OMI Enthone and Atotech and are known, for example, under the trade names "DMSE", "Seleo CP" and "Compact CP", respectively.

Some of these processes are described in the patent literature and examples are given below:

European patent EP 0 616 053 describes a process for applying a metal coating to a non-conductive substrate (without an electroless coating) comprising:
  a. contacting said substrate with an activator comprising a noble metal/Group IVA metal sol to obtain a treated substrate;
  b. contacting said treated substrate with a self accelerating and replenishing immersion metal composition having a pH above 11 to pH 13 comprising a solution of;
    (i) a Cu(II), Ag, Au or Ni soluble metal salt or mixtures thereof,
    (ii) a Group IA metal hydroxide,
    (iii) a complexing agent comprising an organic material having a cumulative formation constant log K of from 0.73 to 21.95 for an ion of the metal of said metal salt.

This process results in a thin conductive layer which can be used for subsequent electrocoating. This process is known in the art as the "Connect" process.

U.S. Pat. No. 5,503,877 describes the metallisation of non-conductive substrates involving the use of complex compounds for the generation of metal seeds on a non-metallic substrate. These metal seeds provide for sufficient conductivity for subsequent electroplating. This process is known in the art as the so-called "Neoganth" process.

U.S. Pat. No. 5,693,209 relates to a process for metallisation of a non-conductive substrate involving the use of conductive pyrrole polymers. The process is known in the art as the "Compact CP" process.

European patent 1 390 568 B1 also relates to direct electrolytic metallisation of non-conductive substrates. It involves the use of conductive polymers to obtain a conductive layer for subsequent electrocoating. The conductive polymers have thiophene units. The process is known in the art as the "Seleo CP" process.

Finally, the non-conductive substrate can also be activated with a colloidal or an ionogenic palladium ion containing solution, methods for which are described, for example, in Handbuch der Leiterplattentechnik, Vol. 4, 2003, pages 307 to 311.

Subsequent electroless plating of a thin intermediate metal coating can optionally been carried out in order to enhance the conductive seed layer. With assistance of the seed layer, electroplating of the solder deposit according to the present invention can then be carried out.

According to the present invention, said conductive seed layer 101 may be made of a metal or an alloy or made of multilayer of metals, such as copper, tin, cobalt, tin-lead alloy, chromium-copper alloy, titanium/nickel (bi-metal), tin/copper, chromium/chromium-copper alloy/copper, or nickel/tin/copper multi-layer. Copper is preferred as a seed layer.

In accordance with a preferred embodiment of the present invention, said seed layer 101 can also be formed by an electroless plating method, wherein the catalytic metal does not use noble metal but uses copper as the catalytic metal. The typical examples for forming such a catalytic copper on a non-conductive surface can be found in the U.S. Pat. Nos. 3,993,491 and 3,993,848.

The thickness of said seed layer 101 preferably is less than 0.1 millimeter and more preferably between 0.0001 millimeter and 0.005 millimeter. Depending on the solubility of said seed layer 101 in the solder material, said seed layer 101 can either completely dissolve into the solder deposit or still at least partially exist after the reflow process.

A thinner said seed layer 101 is preferred, since the thinner seed layer can be removed sooner in the etching solution, the time required for said non-conductive substrate 105 immersed in an etching solution could be shortened. In such a case, the damages to said solder mask layer 103 by said etching solution will be lowered down to an acceptable low level.

It is an advantage of the method of the present invention that no resist layer needs to be applied on selective areas of the substrate surface prior to electroplating the solder deposit.

Figure 1C:
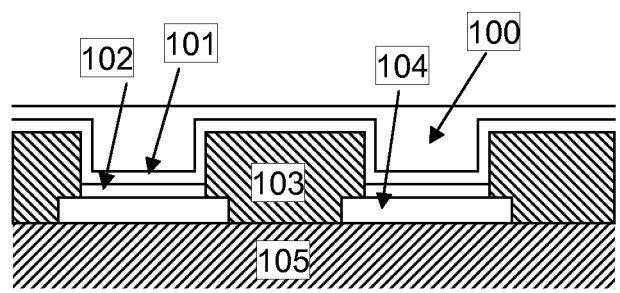

Referring now to FIG. 1c a solder material layer 100 containing tin or tin alloy is then formed on the conductive seed layer 101.

In accordance with a preferred embodiment of the present invention, said solder material 100 is a tin or tin alloy made by the mixture of tin and the elements selected from the group consisting of lead, silver, copper, bismuth, antimony, zinc, nickel, aluminum, magnesium, indium, tellurium, nickel and gallium.

Tin and tin alloy plating baths are known in the art. Commonly used tin or tin alloy plating bath compositions and process parameters for plating are described in the following.

Among other components of the bath may be added a source of $Sn^{2+}$ ions, an anti-oxidant, and a surfactant.

The source of $Sn^{2+}$ ions may be a soluble tin-containing anode, or, where an insoluble anode is used, a soluble $Sn^{2+}$ ion source. Tin methane sulfonic acid, $Sn(MSA)_2$, is a preferred source of $Sn^{2+}$ ions because of its high solubility.

Typically, the concentration of the source of $Sn^{2+}$ ions is sufficient to provide between about 10 g/L and about 100 g/L of $Sn^{2+}$ ions into the bath, preferably between about 15 g/L and about 95 g/L, more preferably between about 40 g/L and about 60 g/L. For example, $Sn(MSA)_2$ may be added to provide between about 30 g/L and about 60 g/L $Sn^{2+}$ ions to the plating bath.

A preferred alloy is tin silver alloy. In such case the plating bath additionally contains a soluble silver salt, commonly used are nitrate, acetate, and preferably methane sulfonate. Typically, the concentration of the source of $Ag^+$ ions is sufficient to provide between about 0.1 g/L and about 1.5 g/L of $Ag^+$ ions into the bath, preferably between about 0.3 g/L and about 0.7 g/L, more preferably between about 0.4 g/L and about 0.6 g/L. For example, Ag(MSA) may be added to provide between about 0.2 g/L and about 1.0 g/L $Ag^+$ ions to the plating bath.

Anti-oxidants may be added to the baths of the present invention to stabilize the bath against oxidation of $Sn^{2+}$ ions in solution. Preferred anti-oxidants such as hydroquinone, catechol, and any of the hydroxyl, dihydroxyl, or trihydroxyl benzoic acids and mono-, di- or tri-substituted pyridine derivatives selected from the group consisting of 2-amino-3-hydroxy-pyridine, 3-amino-2-hydroxy-pyridine, 2,3-dihydroxy-pyridine, 3,4-dihydroxy-pyridine, 2,5-dihydroxy-pyridine, 2,3,4-trihydroxy-pyridine, 3,4,5-trihydroxy-pyridine, 2,3-diamino-pyridine, 3,4-diamino-pyridine, 2,5-diamino-pyridine, 3-amino-4,5-dihydroxy-pyridine, 4-amino-3,5-dihydroxy-pyridine, 4-amino-2,5-dihydroxy-pyridine, 4-amino-2,3-dihydroxy-pyridine, 3,4-diamino-2-hydroxy-pyridine, 3,4-diamino-5-hydroxy-pyridine, 2,3-diamino-4-hydroxy-pyridine, 2,3-diamino-5-hydroxy-pyridine, 3,4-diamino-2-hydroxy-5,6-dimethyl-pyridine, 3,4-diamino-5-hydroxy-2,6-dimethyl-pyridine, 2,3-diamino-4-hydroxy-5,6-dimethyl-pyridine, 4-amino-2,3-dihydroxy-5,6-dimethyl-pyridine, 3-amino-4,5-dihydroxy-2,6-dimethyl-pyridine, 2,5-diamino-3,4,6-trimethyl-pyridine, 3,4-diamino-2,5,6-trimethyl-pyridine, 2,3-diamino-4,5,6-trimethyl-pyridine, 3,4,5-trihydroxy-2,6-dimethyl-pyridine, 2,3,4-trihydroxy-5,6-dimethyl-pyridine, 2,5-dihydroxy-3,4,6-trimethyl-pyridine, 3,4-dihydroxy-2,5,6-trimethyl-pyridine, 2,3-dihydroxy-4,5,6-trimethyl-pyridine, 3-amino-2-hydroxy-4,5,6-trimethyl-pyridine, 2-amino-3-hydroxy-4,5,6-trimethyl-pyridine and corresponding ethyl-, propyl- and alkoxy-derivatives may be added in a concentration between about 0.1 g/L and about 10 g/L, preferably between about 0.5 g/L and about 3 g/L. For example, hydroquinone may be added to the bath at a concentration of about 2 g/L.

Surfactants may be added to promote wetting of the substrate. The surfactant seems to serve as a mild deposition inhibitor which can suppress three-dimensional growth to an extent, thereby improving morphology and topography of the film. It can also help to refine the grain size, which yields a more uniform bump. Exemplary anionic surfactants include alkyl phosphonates, alkyl ether phosphates, alkyl sulfates, alkyl ether sulfates, alkyl sulfonates, alkyl ether sulfonates, carboxylic acid ethers, carboxylic acid esters, alkyl aryl sulfonates, aryl alkylether sulfonates, aryl sulfonates, and sulfosuccinates.

The electrolytic plating bath of the present invention preferably has an acidic pH to inhibit anodic passivation, achieve better cathodic efficiency, and achieve a more ductile deposit. Accordingly, the bath pH is preferably between about 0 and about 3. In the preferred embodiment the pH of the bath is 0. Accordingly, the preferred acidic pH can be achieved using nitric acid, acetic acid, and alkyl sulphonic acids such as methane sulfonic acid (MSA). In one preferred embodiment, the acid is methane sulfonic acid. The concentration of the acid is preferably between about 50 g/L and about 200 g/L, more preferably between about 70 g/L and about 120 g/L. For example, between about 50 g/L and about 160 g/L methane sulfonic acid can be added to the electroplating bath to achieve a bath of pH 0 and act as the conductive electrolyte.

The electrolytic bath of the present invention furthermore contains at least one leveling agent which include but are not limited to aromatic aldehydes and ketones selected from the group consisting of benzylidene acetone, benzaldehyde, 3-chlorobenzaldehyde, 4-chlorobenzaldehyde, 2,4-dichlorobenzaldehyde, 2,6-dichlorobenzaldehyde, 2,4,6-trichlorobenzaldehyde, 1-naphtaldehyde, 2-naphthaldehyde, 2-hydroxybenzaldehyde, 3-hydroxybenzaldehyde, 4-hydroxybenzaldehyde, 2-methylbenzaldehyde, 3-methylbenzaldehyde, 4-methylbenzaldehyde, m-anisaldehyde, o-anisaldehyde, p-anisaldehyde, 2-chloroacetophenone, 3-chloroacetophenone, 4-chloroacetophenone, 2,4-dichloroacetophenone, 2,4,6-trichloroacetophenone. The term 'aromatic carbonyl compound' is used here as a synonym for aromatic aldehyde and aromatic ketone compounds and does not include '$\alpha/\beta$-unsaturated carboxylic acids'. Said aromatic carbonyl compound leveling agent is added to the electrolyte in an amount of 0.001 g/l to 0.5 g/l, more preferred between 0.005 g/l to 0.1 g/l.

In another embodiment, the electrolyte further contains beside the at least one leveling agent which is an aromatic carbonyl compound, at least one further type of leveling agent which is an $\alpha/\beta$-unsaturated carboxylic acid or a derivative thereof. Preferably, the $\alpha/\beta$-unsaturated carboxylic acid is selected from the group consisting of acrylic acid, methacrylic acid, crotonic acid, 3-chloroacrylic acid, 3,3-dimethylacrylic acid, 2,3-dimethylacrylic acid, methyl acrylate, ethyl acrylate, n-butyl acrylate, i-butyl acrylate 2-ethylhexyl acrylate, ethyl methacrylate, n-butyl methacrylate, i-butyl methacrylate, 2-hydroxyethyl methacrylate, 2-hydroxypropyl methacrylate, 2-dimethylaminoethyl methacrylate, methacrylis anhydride and methyl methacrylic acid. The at least one leveling agent which is a $\alpha/\beta$-unsaturated carboxylic acid is present in the electrolyte in a concentration which ranges from 0.05 g/l to 3 g/l, more preferred between 0.1 g/l and 0.5 g/l.

In one embodiment of the present invention, the brightening agent is a mixture of benzylidene acetone, 1-naphtaldehyde and methacrylic acid, wherein the concentration of benzylidene acetone ranges between 0.01 g/l and 0.3 g/l, more preferred between 0.005 g/l and 0.02 g/l and wherein the concentration of 1-naphtaldehyde ranges between 0.001 g/l and 0.2 g/l, more preferred 0.005 g/l and 0.02 g/l and wherein the concentration of methacrylic acid ranges between 0.05 g/l and 3 g/l, more preferred 0.1 g/l to 0.5 g/l.

Typical bath compositions are for example disclosed in: Jordan: The Electrode-position of Tin and its Alloys, 1995, p. 71-84.

The plating of tin and tin alloys for solder depot plating can be performed by direct current (DC) or pulse plating. Pulse plating techniques are particularly suitable to fill structures of the present invention as shown in FIGS. 1-15. The advantages of pulse plating are better surface distribution uniformity and improved crystal structures with tin deposits possessing finer grain sizes and therefore better solderability properties. Also, higher applicable current density and therefore higher throughput can be obtained by pulse plating compared to DC plating.

Generally, current pulses at an effective current density of 1-20 A/dm$^2$ can be applied. Alternatively, operating of the bath with DC at a current density of 1-3 A/dm$^2$ can be performed.

For example, applying a tin pulse plating with a current density of 3 A/dm$^2$ yields an average thickness of the tin deposit of 40 μm within 30 min. plating time. The thickness variation on the surface is only +/−15%. Applying DC plating a maximum current density of only 1 A/dm$^2$ can be obtained. Plating time to obtain a thickness of the tin deposit of 40 μm is 86 min. The variation on the surface is +/−33%, thus much higher than for pulse plating.

Preferred pulse parameters are as follows:

The ratio of the duration of the at least one forward current pulse to the duration of the at least one reverse current pulse is adjusted to at least 1:0-1:7, preferably to at least 1:0.5-1:4 and more preferably to at least 1:1-1:2.5.

The duration of the at least one forward current pulse can be adjusted to preferably at least 5 ms to 1000 ms.

The duration of the at least one reverse current pulse is preferably adjusted to 0.2-5 ms at most and most preferably to 0.5-1.5 ms.

The peak current density of the at least one forward current pulse at the workpiece is preferably adjusted to a value of 1-30 A/dm$^2$ at most. Particularly preferable is a peak current density of the at least one forward current pulse at the workpiece of about 2-8 A/dm$^2$ in horizontal processes. In vertical processes the most preferred peak current density of the at least one forward current pulse at the workpiece is 1-5 A/dm$^2$ at most.

The peak current density of the at least one reverse current pulse at the work piece will preferably be adjusted to a value of 0-60 A/dm$^2$. Particularly preferred is a peak current density of the at least one reverse current pulse at the workpiece of about 0-20 A/dm$^2$ in horizontal processes. In vertical processes the most preferred peak current density of the at least one forward current pulse at the workpiece is 0-12 A/dm$^2$ at most.

The openings in the structures according to the FIGS. 1-8 are denoted SRO (solder resist openings) and preferably have a dimension of about 5-1.000 μm, preferably of about 10-500 μm and even more preferred 20-100 μm.

The height of the SROs varies between 5-250 μm, preferably of about 10-50 μm. The distance of the center points of adjacent contacts areas is denoted as pitch and ranges from 90-300 μm for IC substrates, and from 150-1.000 μm for printed circuits.

Since also the solder mask 104 is covered by a conductive seed layer 101 plating of the solder deposit 100 is also on this layer. The thickness of such layer 100 should preferably not exceed 1-10 μm and more preferred not exceed 3-6 μm.

Figure 1D:
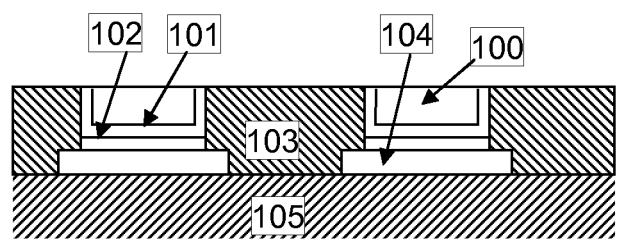
Figure 2A:
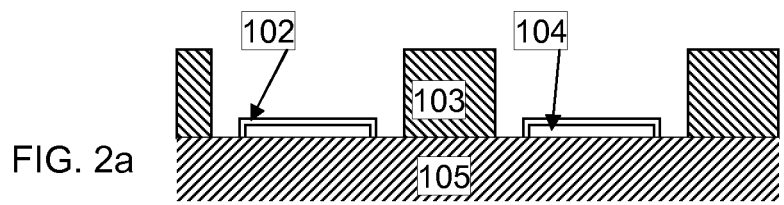
FIGS. 2(a)-2(d) shows a method to obtain a non-solder mask defined pad with a planarized electroplated solder material layer.
Figure 2B:
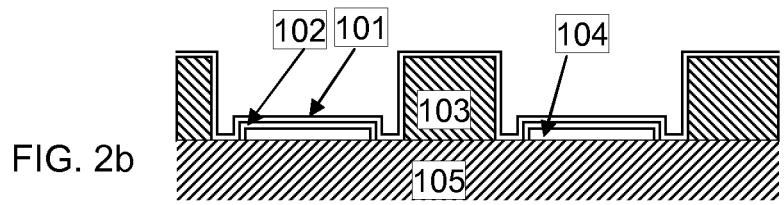
Figure 2C:
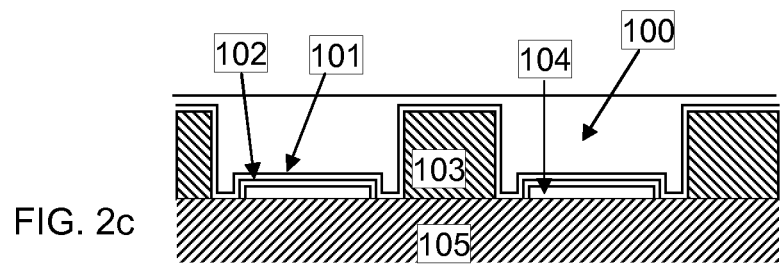
Figure 2D:
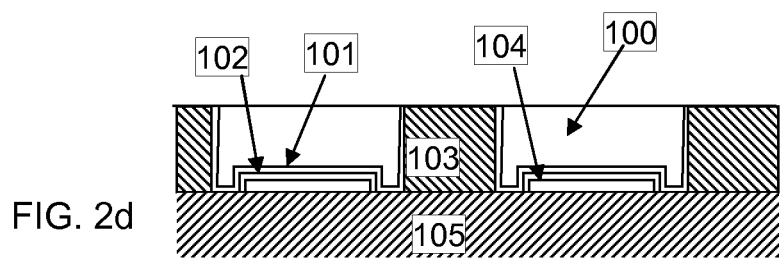
Figure 3A:
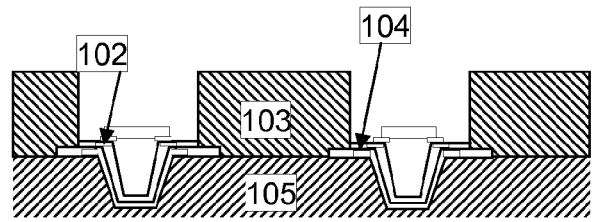
FIGS. 3(a)-3(b) shows a method to obtain a solder mask defined pad with a blind micro via (BMV) possessing a planarized electroplated solder material layer.
Figure 3B:
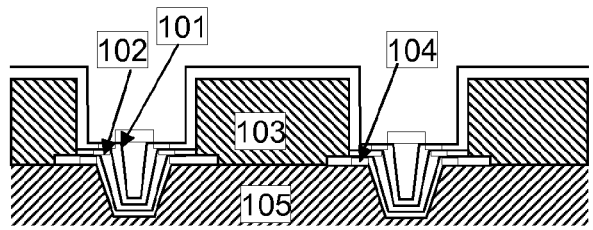
Figure 3C:
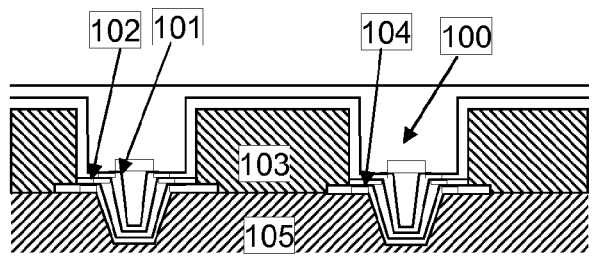
Figure 3D:
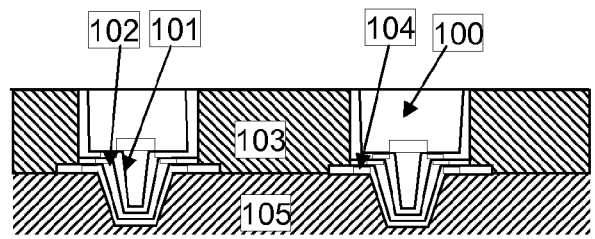
Figure 4A:
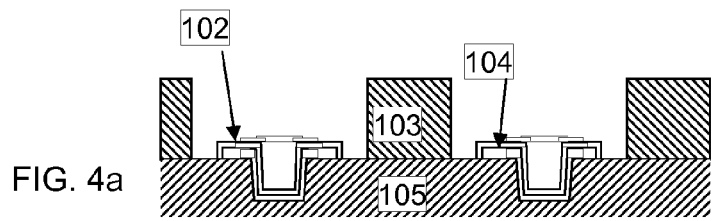
FIGS. 4(a)-4(d) shows a method to obtain a non-solder mask defined pad with a blind micro via (BMV) possessing a planarized electroplated solder material layer.
Figure 4B:
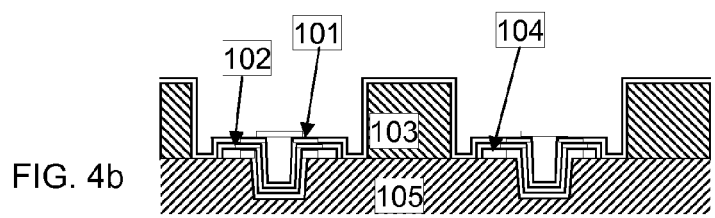
Figure 4C:
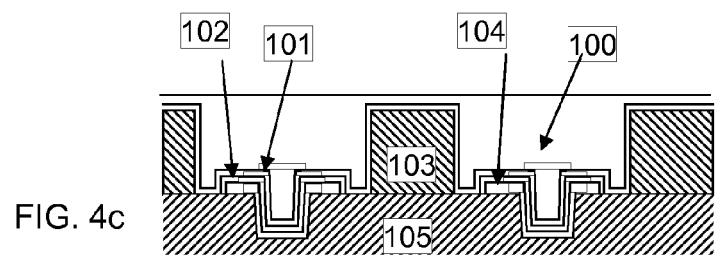
Figure 4D:
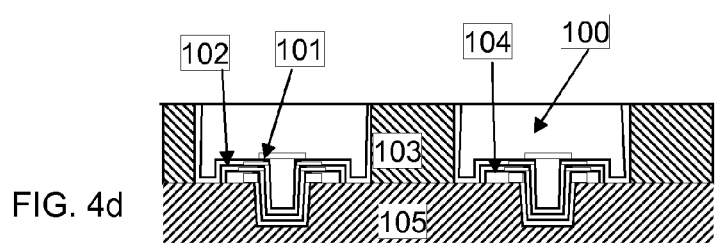
Figure 5A:
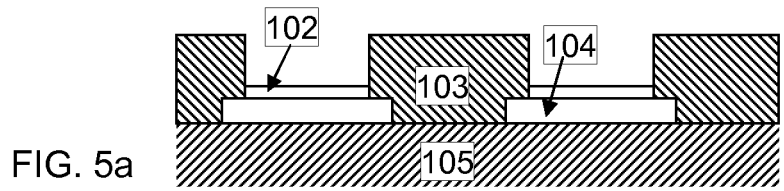
FIGS. 5(a)-5(f) shows a method to obtain a solder mask defined pad with individual heights of the electroplated solder material layer which is subjected to a reflow process.
Figure 5B:
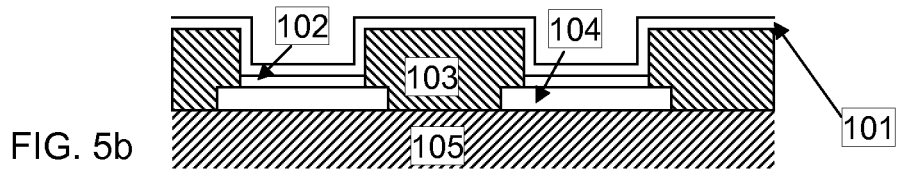
Figure 5C:
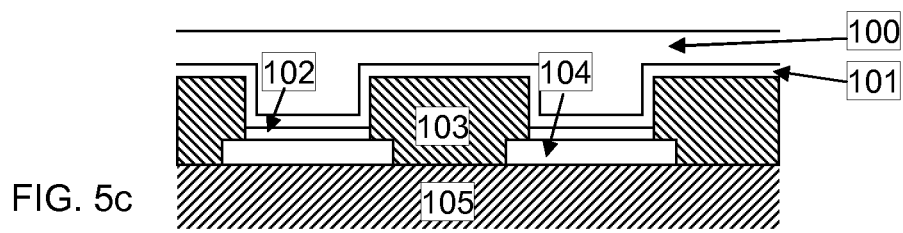
Figure 5D:
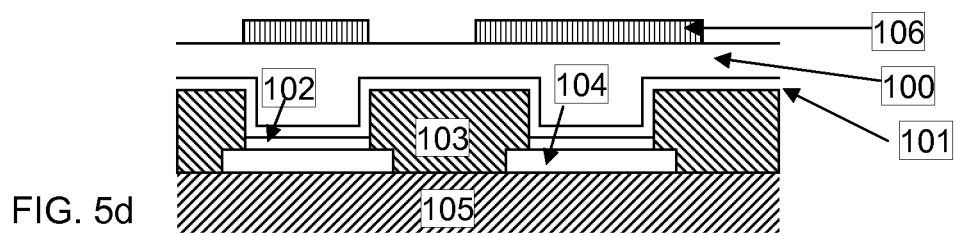
Figure 5E:
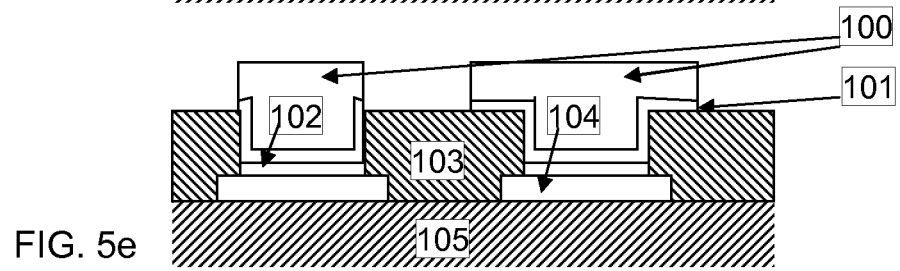
Figure 5F:
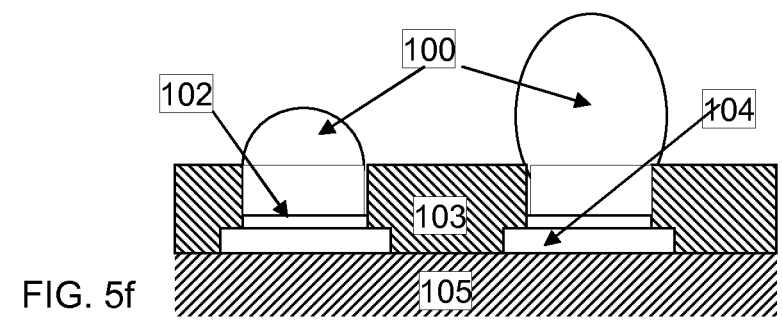
Figure 6A:
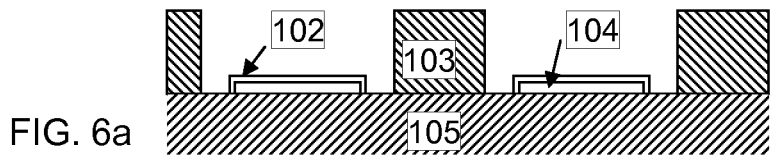
FIGS. 6(a)-6(f) shows a method to obtain a non-solder mask defined pad with individual heights of the electroplated solder material layer which is subjected to a reflow process.
Figure 6B:
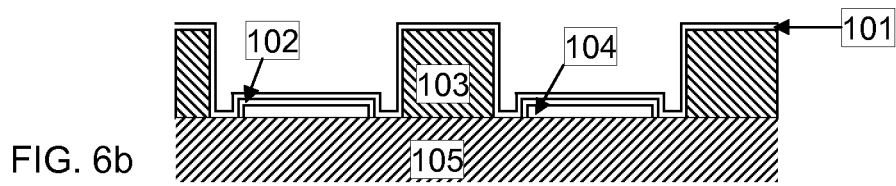
Figure 6C:
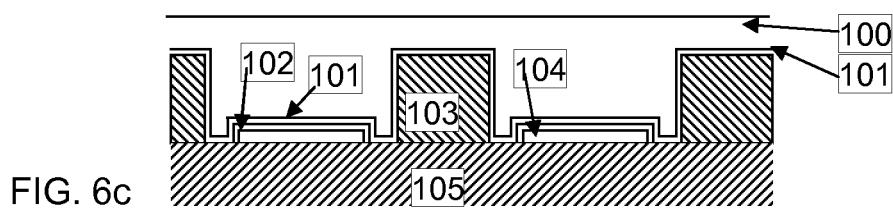
Figure 6D:
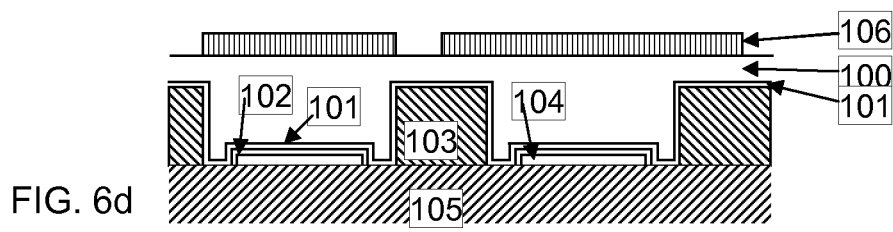
Figure 6E:
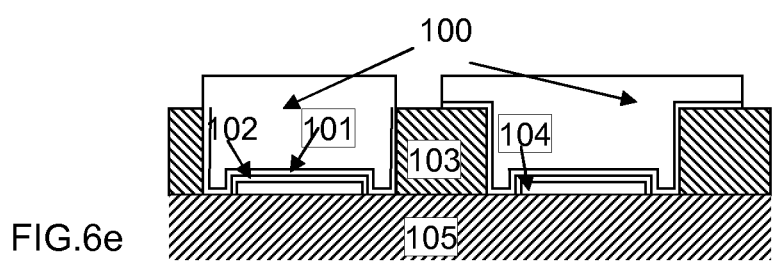
Figure 6F:
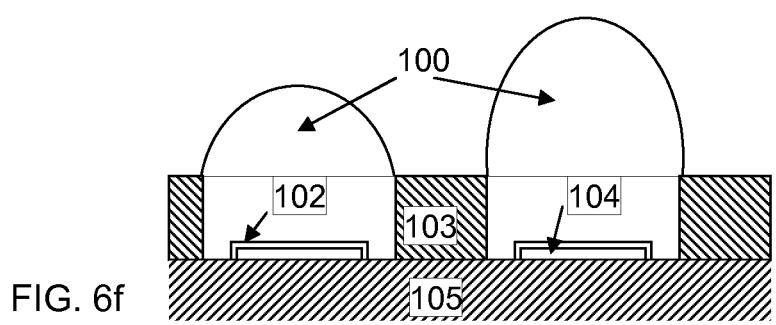
Figure 7A:
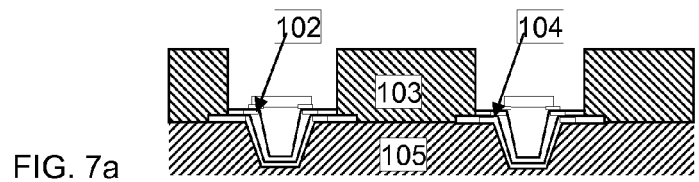
FIGS. 7(a)-7(f) shows a method to obtain a solder mask defined pad with a blind micro via (BMV) possessing electroplated solder material layers of individual heights subjected to a reflow process.
Figure 7B:
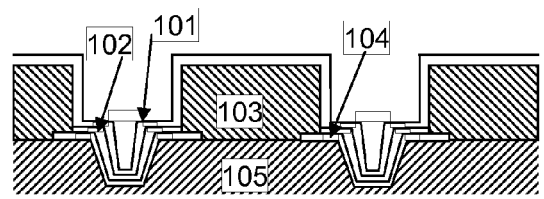
Figure 7C:
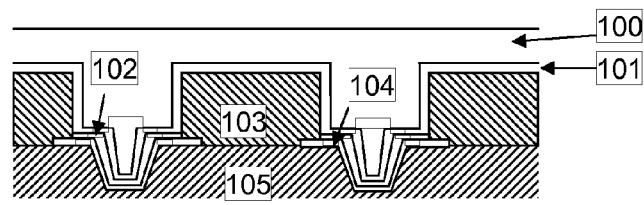
Figure 7D:
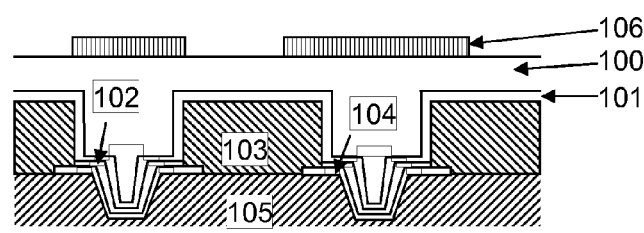
Figure 7E:
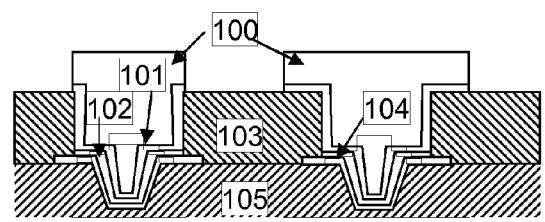
Figure 7F:
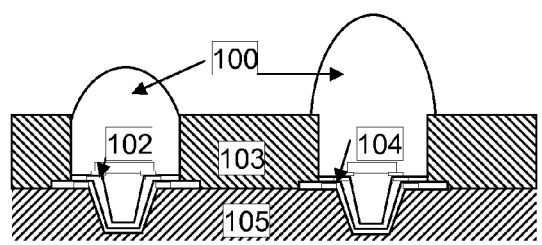
Figure 8A:
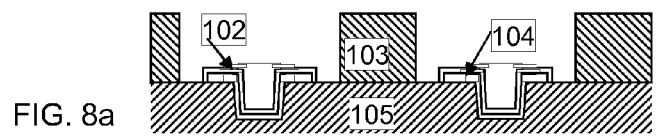
FIGS. 8(a)-8(f) shows a method to obtain a non-solder mask defined pad with a blind micro via (BMV) possessing electroplated solder material layers of individual heights subjected to a reflow process.
Figure 8B:
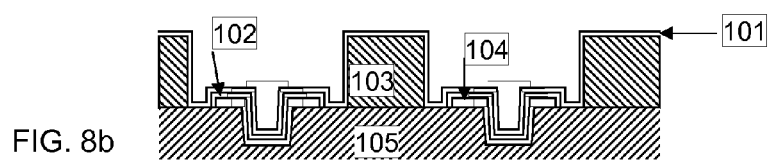
Figure 8C:
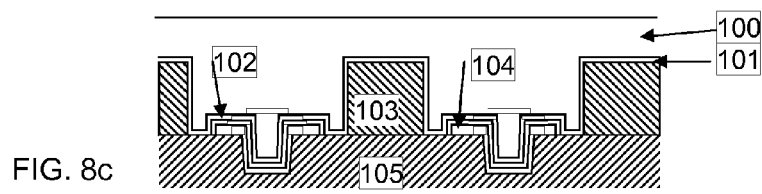
Figure 8D:
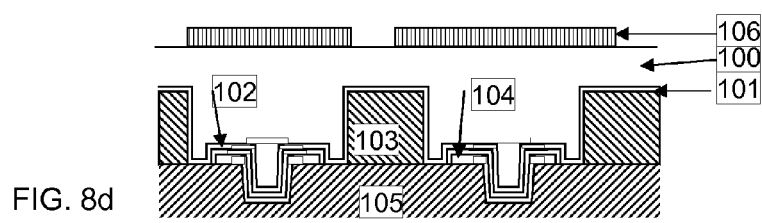
Figure 8E:
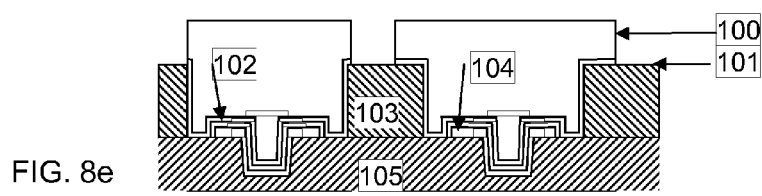
Figure 8F:
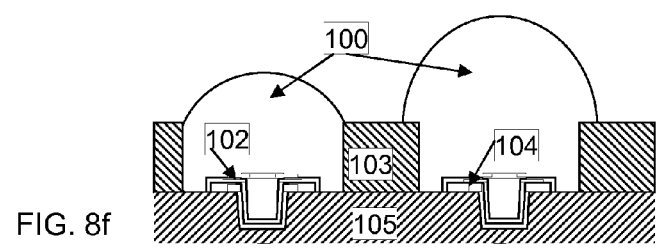
Figure 12A:
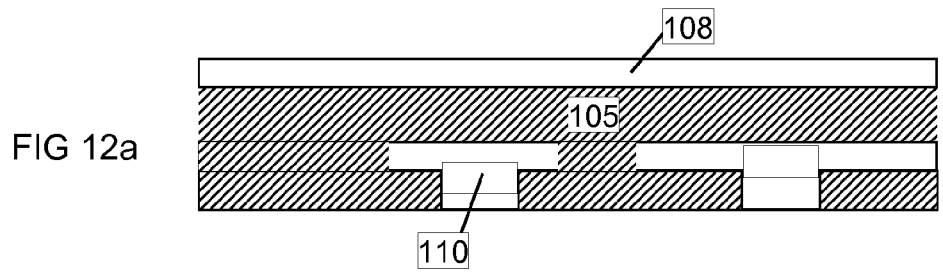
FIGS. 12(a)-12(j) shows a method to obtain a solder mask defined pad with a blind micro via (BMV) possessing a planarized electroplated solder deposit.
Figure 12B:
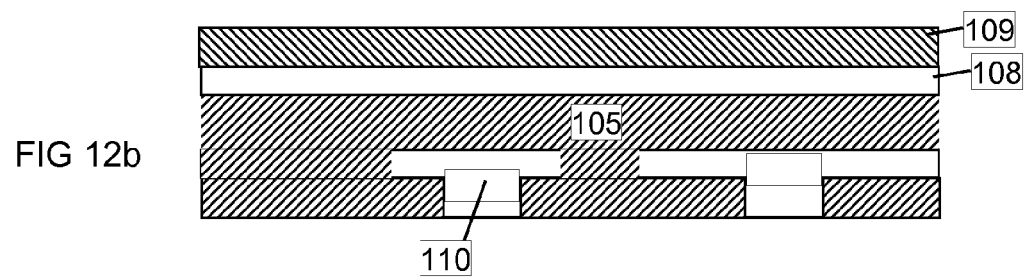
Figure 12C:
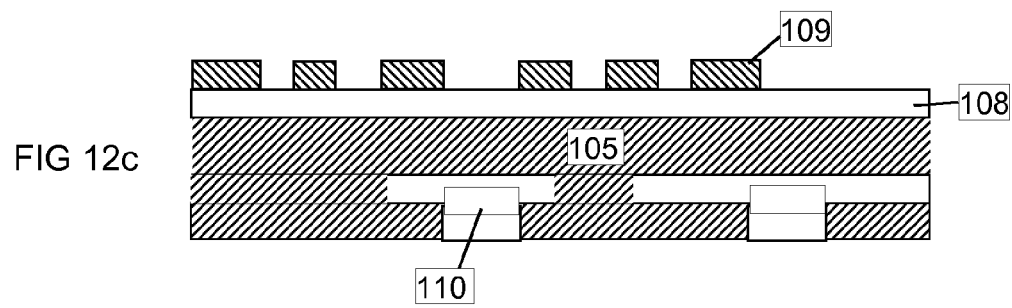
Figure 12D:
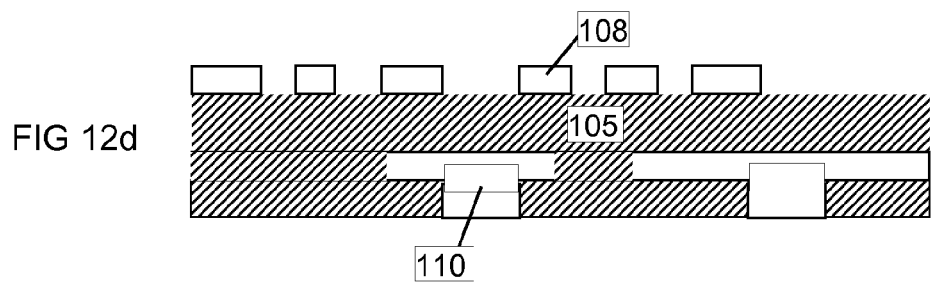
Figure 12E:
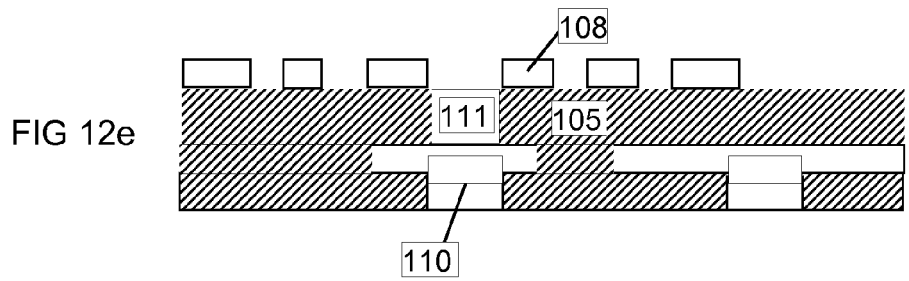
Figure 12F:
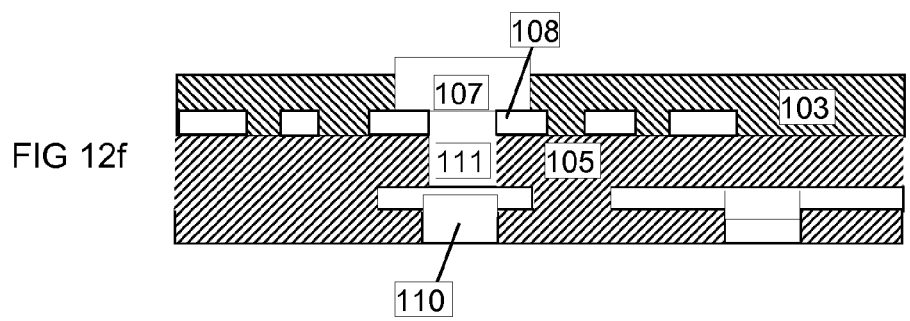
Figure 12G:
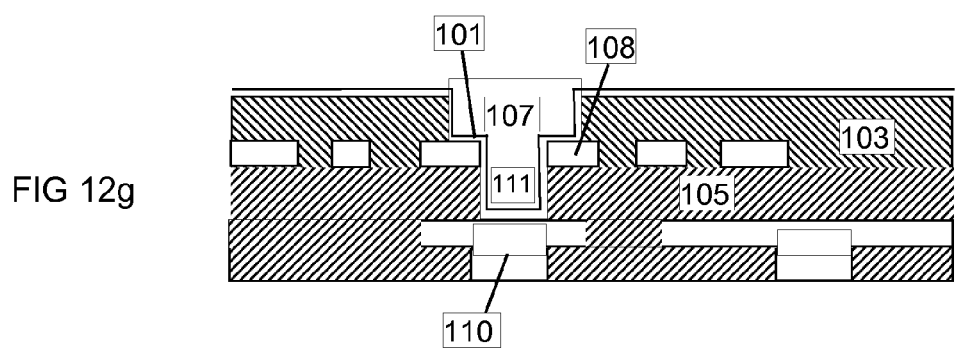
Figure 12H:
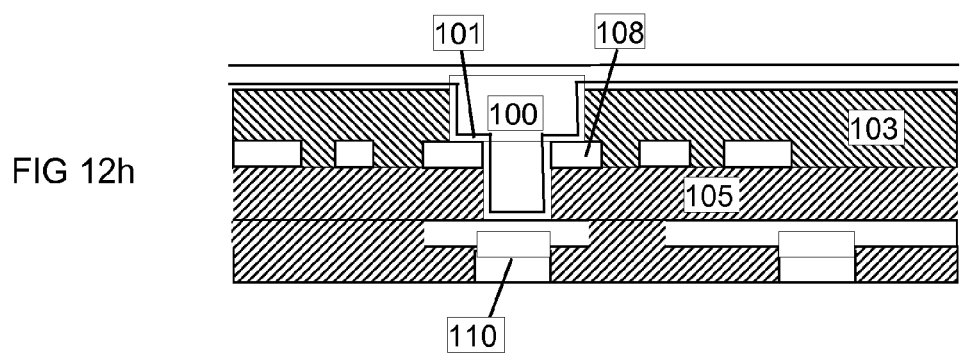
Figure 12I:
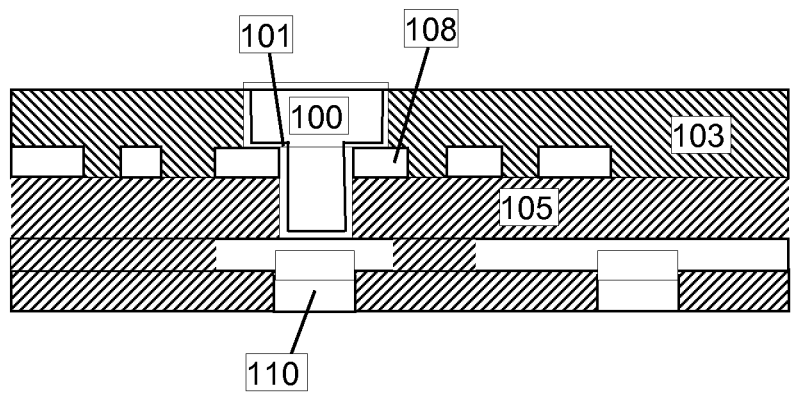
Figure 12J:
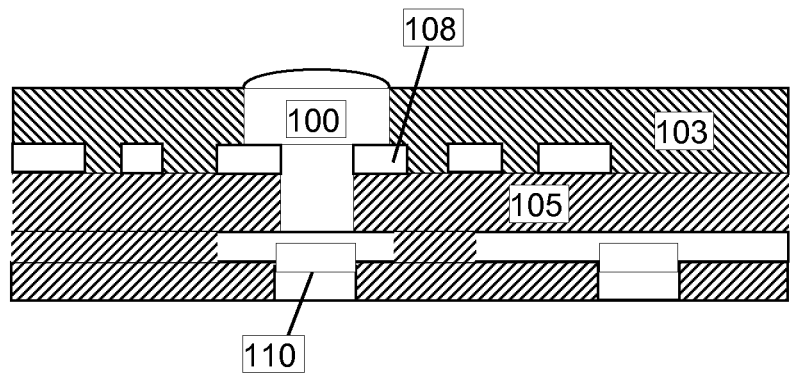
Figure 13A:
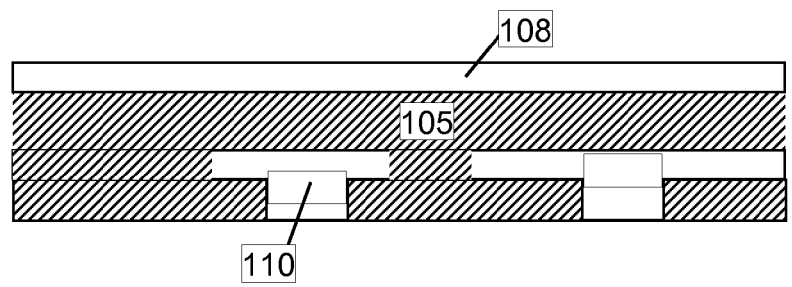
FIGS. 13(a)-13(h) shows a method to obtain a solder mask defined pad with a blind micro via (BMV) possessing a planarized electroplated solder solder deposit and a barrier layer.
Figure 13B:
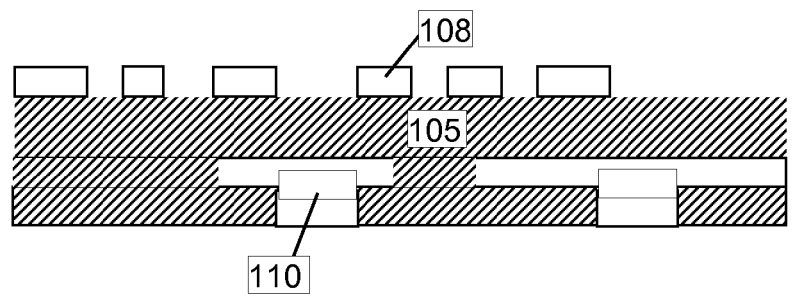
Figure 13C:
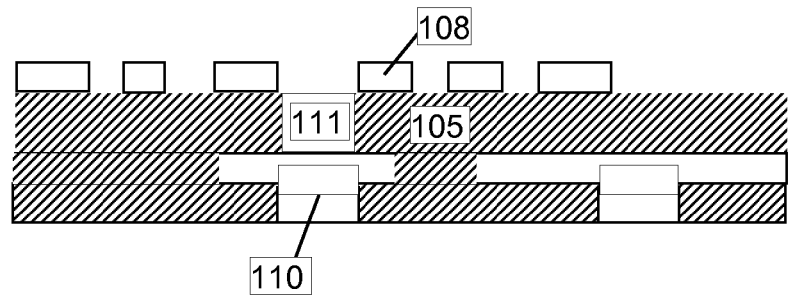
Figure 13D:
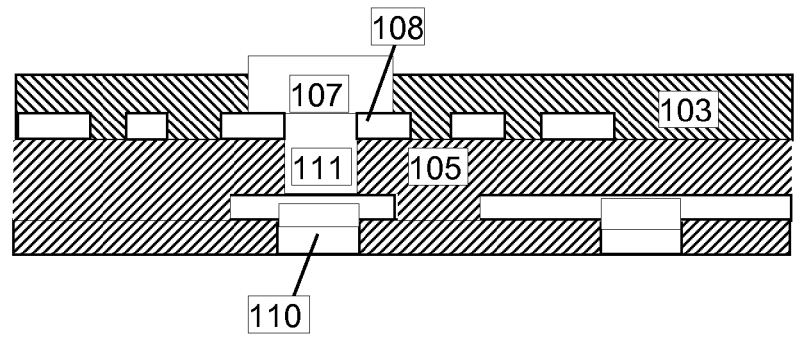
Figure 13E:
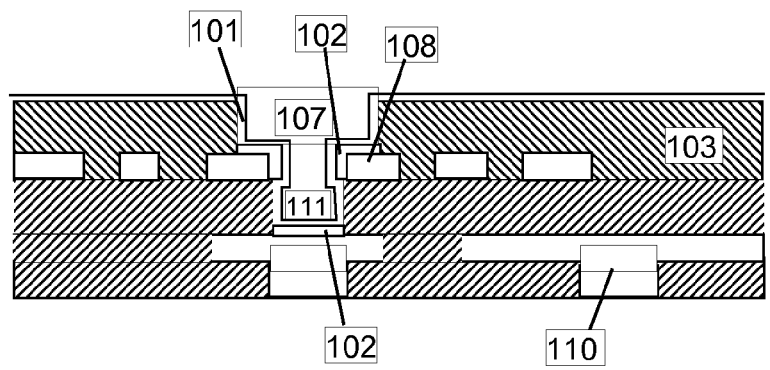
Figure 13F:
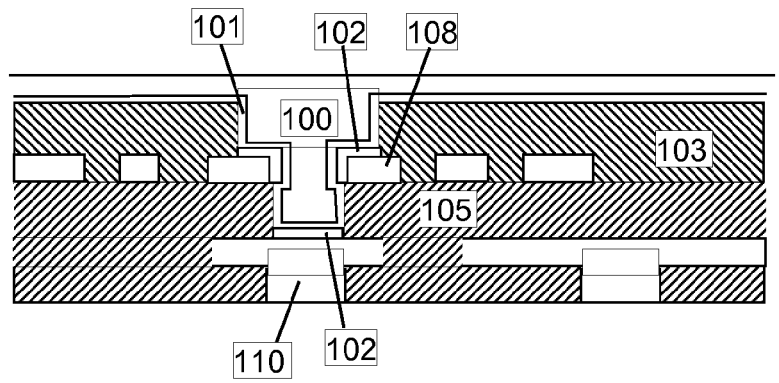
Figure 13G:
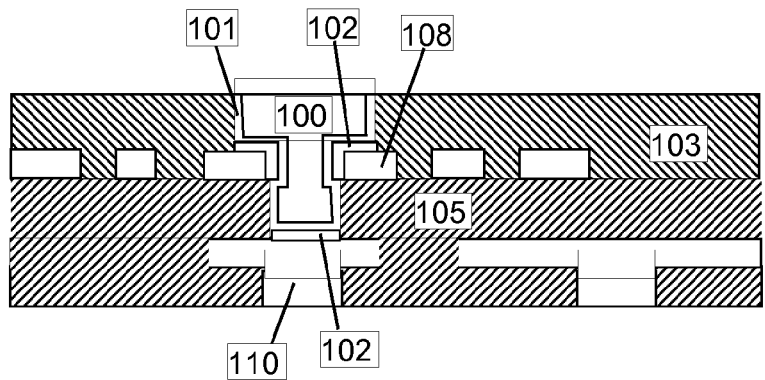
Figure 13H:
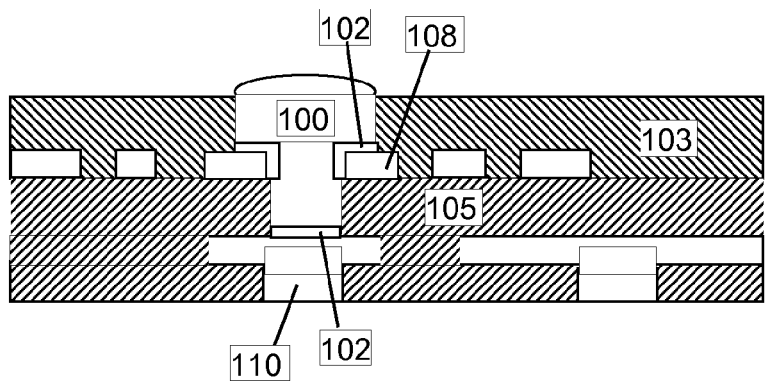
Figure 14A:
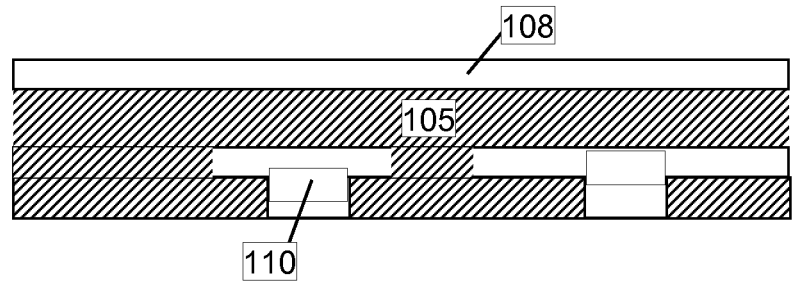
FIGS. 14(a)-14(h) shows a method to obtain a solder mask defined pad with stacked blind micro vias (BMV) possessing a planarized electroplated solder deposit.
Figure 14B:
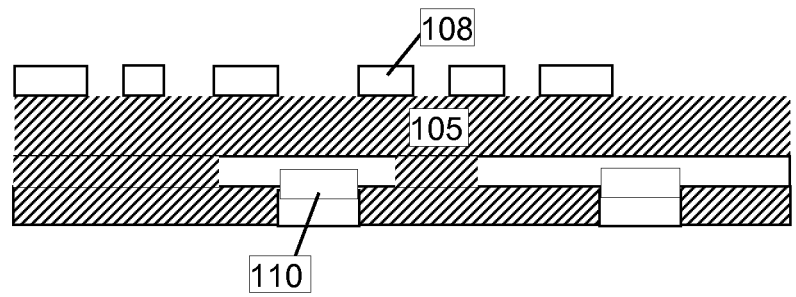
Figure 14C:
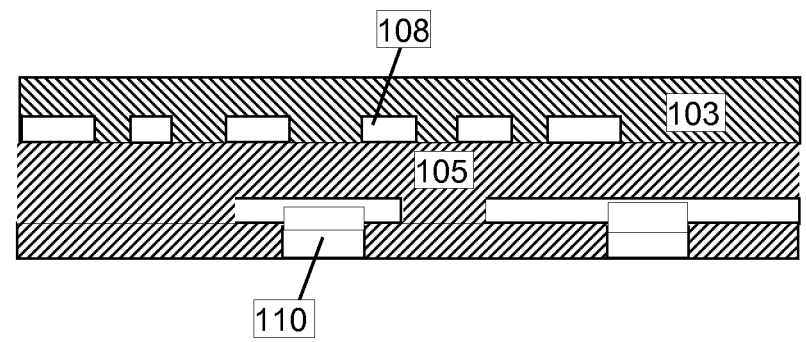
Figure 14D:
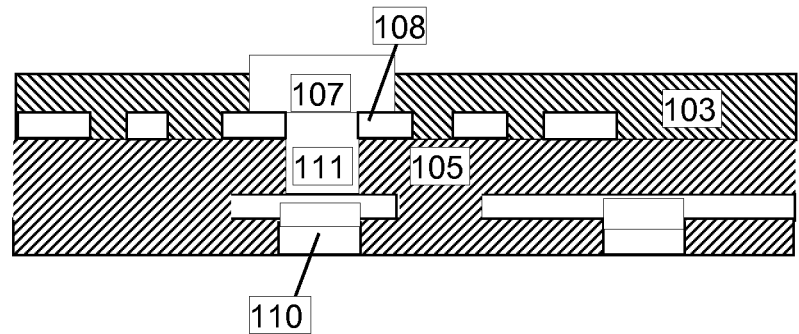
Figure 14E:
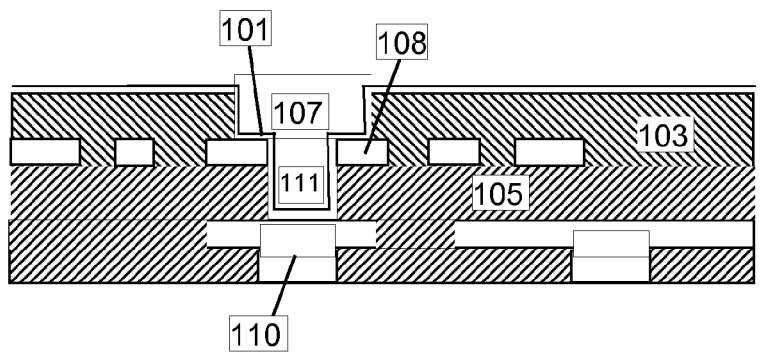
Figure 14F:
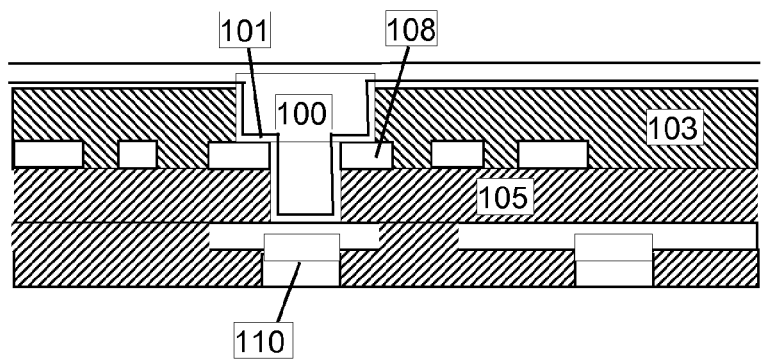
Figure 14G:
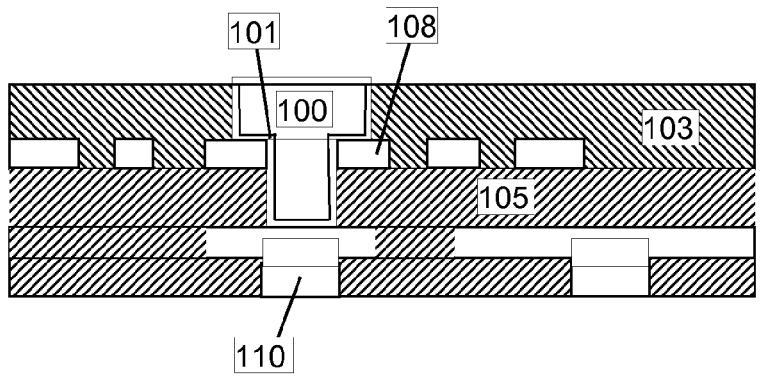
Figure 14H:
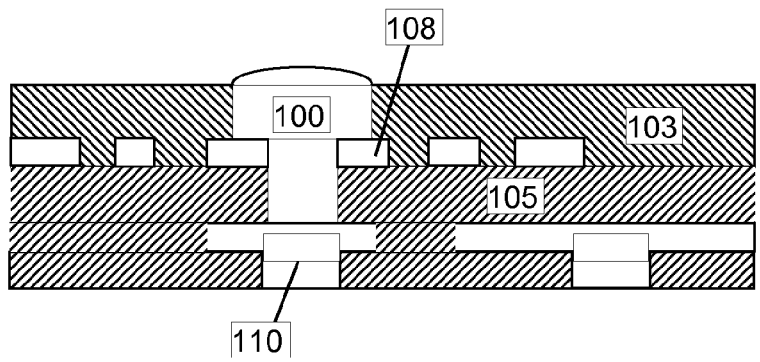
Figure 15A:
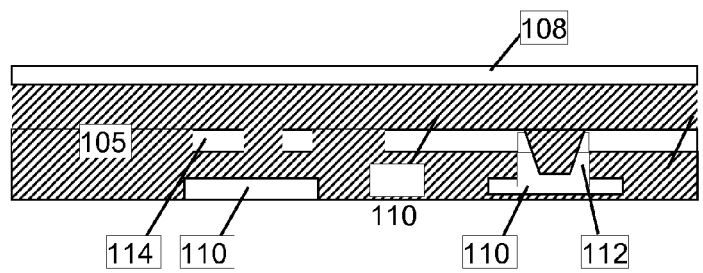
FIGS. 15(a)-15(g) shows a method to obtain a solder mask defined pad with a stacking blind micro via.
Figure 15B:
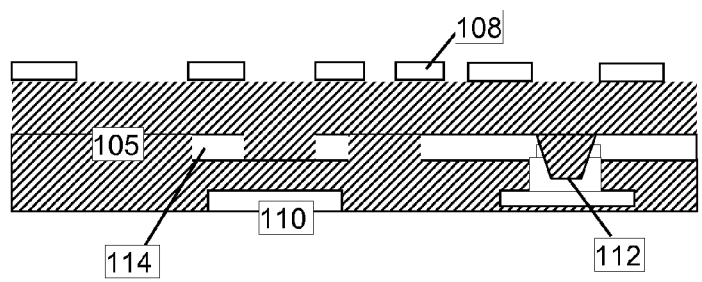
Figure 15C:
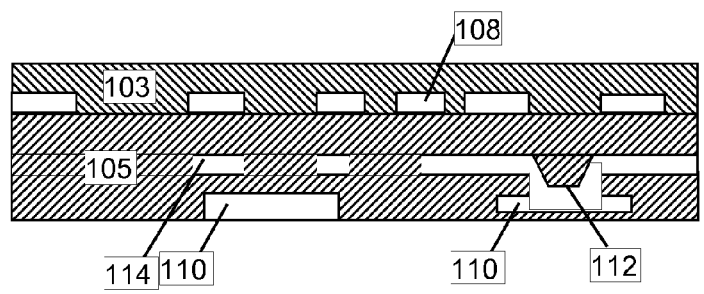
Figure 15D:
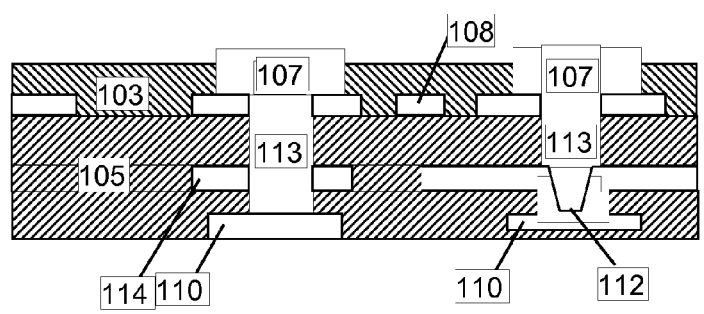
Figure 15E:
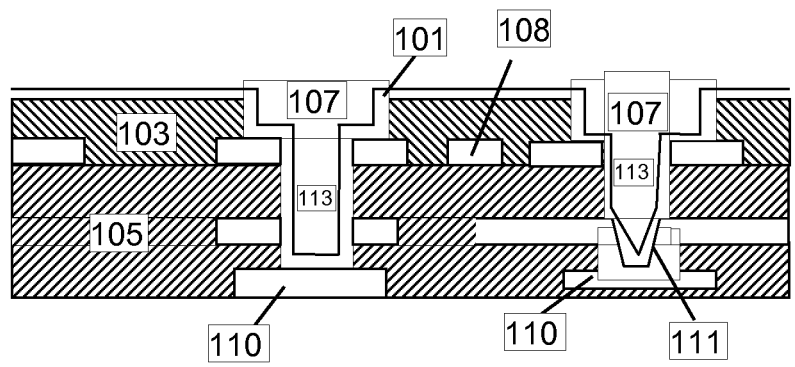
Figure 15F:
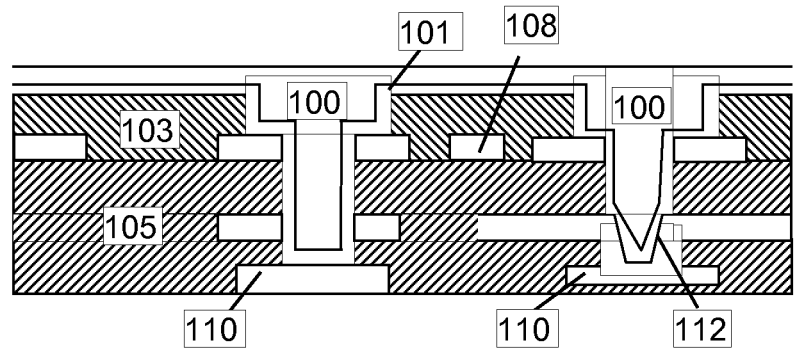
Figure 15G:
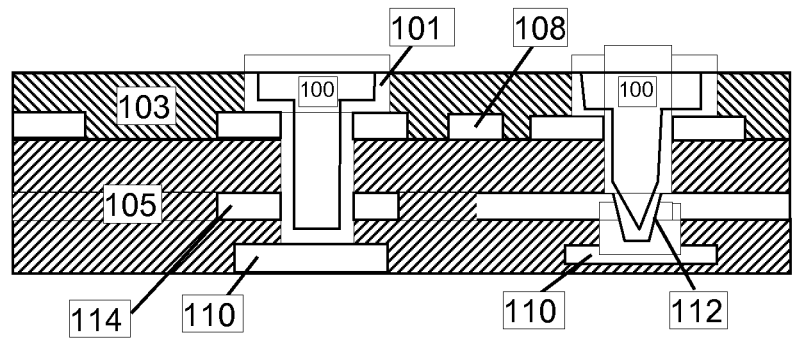

Referring to FIG. 1d, the solder deposit 100 as well as the conductive seed layer 101 is being removed from the solder mask layer 103. The removal preferably is performed by chemical etching an amount of the solder material layer containing tin or tin alloy sufficient to remove the solder deposit layer 100 and the conductive seed layer 101 from the solder mask layer area 103 leaving a solder material layer on the at least one contact area. The etching of tin and tin alloys, also known as stripping, can be performed electrolytically or chemically. Also, mechanical polishing may be applied alone or in combination with electrolytical or chemical stripping to remove the solder deposit layer 100 and the conductive seed layer 101.

Generally the tin or tin alloy solder deposit 100 and the conductive seed layer 101 can be removed in a single etching step with the same etching solution. In some cases it may be advantageous, however, to apply different etching solutions for removing first the solder deposit layer 100 on the solder mask area 103 and thereafter the conductive seed layer 101. Suitable etching solutions can be chosen applying routine experiments.

Typical etching or stripping compositions are for example disclosed in: Jordan: The Electrodeposition of Tin and its Alloys, 1995, p. 373-377.

During electrolytic stripping methods tin or its alloys are anodically dissolved in a 10 wt. % NaOH solution at 70-90° C.

Chemical stripping generally is performed in solutions containing a strong base like NaOH (about 10 wt. %) at elevated temperatures of 70-90° C. Organic additives, particularly nitroaromtaic compounds like p-nitrophenol, may be added to the solution.

Alternatively, chemical stripping can be performed in the following solutions:
  hydrogen peroxide, often with added fluoride,
  systems based on nitric acid and nitrates, 5-40 wt. % of nitrate,
  systems based on HCl/copper chloride, containing 5-20 wt. % HCl with an initial concentration of 2.5 mg/L copper chloride.

While this process sequence has been described in detail for a substrate according to FIG. 1 it is not limited to such and may be applied to all kind of substrates. Some additional preferred embodiments of the present invention which can be treated accordingly are shown in FIGS. 2-9.

According to the present invention, said solder mask layer 103 is not limited to cover a portion of said contact pad 104 surface. As shown in FIG. 2, said solder mask layer 103 is deposited on the surface of said non-conductive surface 105 but does not cover any portion of said contact pad 104 surface. In turn, said conductive seed layer 101 is formed. Subsequently, the solder deposit layer 100 is formed in said opening covering the contact pad 104 as well as the area of the non-conductive surface 105. Such structure is referred to as non-solder mask defined pad substrate.

According to the present invention, said contact pad 104 is not limited to a flat structure. As shown in FIG. 3, said contact pad 104 can be part of a via or trench which is filled with the solder deposit 100. Vias and trenches preferably have a depth of 5-250 μm and a width of 5-200 μm.

Such structure can also be a non-solder mask defined pad substrate as shown in FIG. 4.

According to the present invention, the solder deposit layer 100 is not limited to the openings but can also extend above the openings as shown in FIG. 5. For this embodiment an etch resist 106 is applied onto the solder deposit layer 100 on at least the surface area overlying the at least one contact pad 104 as shown in FIG. 5d. The solder deposit layer 100 as well as the conductive layer 101 is etched away in an amount sufficient to remove both the solder deposit layer and the conductive layer from the solder mask layer 103 leaving a solder deposit layer on the at least one contact pad area. Thereafter the etch resist is being removed. FIG. 5f is an example of the solder deposit 100 being a solder bump after a reflow step.

FIG. 6 is an example for a solder bump embodiment like shown in FIG. 5 possessing a non-solder mask defined contact pad 104.

FIG. 7 is an example for a solder bump embodiment wherein the contact pad 104 is part of a via or trench.

FIG. 8 is an example for a solder bump embodiment wherein the contact pad 104 is part of a via or trench and the contact pad 104 is non-solder mask defined.

FIG. 9. is an example for a non-solder mask defined pad with individual heights of the electroplated solder material layer applying an additional resist. In this embodiment an additional resist 106 is applied on the horizontal surface area of the solder mask 103. Such resist preferably is not applied on the substrate area 105. The purpose of adding additional resist is to increase the amount of solder deposit on the substrate. As becomes apparent from FIG. 9 application of an additional resist layer 106 on top of the solder mask layer 103 does not alter the overall plating sequence and particularly does not affect the benefits of the present invention.

In accordance with a preferred embodiment of the present invention, said solder bumps 100 formed from the solder deposit 100 according to FIGS. 5-9 can be applied for forming flip chip joints. At a reflow temperature, a flip chip joint can be formed.

In accordance with a preferred embodiment of the present invention, said electroplate solder bumps can be applied for forming flip chip joints with metal bumps on the IC chip. At a reflow temperature, a flip chip joint can be formed.

FIG. 10 is an example of a joining process between two substrates according to a preferred embodiment of the present invention, e.g. of a IC-substrate (top) with a printed circuit board (bottom). At a reflow temperature, a flip chip joint can be formed.

FIG. 11 is another example of a joining process between two substrates according to a preferred embodiment of the present invention, e.g. of a IC-substrate (top) with a printed circuit board (bottom). The solder bump has been pre-balled prior to the joining process by a reflow process.

At a reflow temperature, a flip chip joint can be formed.

In accordance with a preferred embodiment of the present invention, said electroplate solder bumps can be applied for forming flip chip joints and board to board solder joints.

The solder bumps can be any shape, such as stud bumps, ball bumps, columnar bumps, or others.

In still another embodiment the method according to the present invention can be used to form flip chip joints and board to board solder joints whereon an electrical circuitry is formed by a print and etch process.

Referring to FIG. 12 wherein a solder mask defined pad with a blind micro via 111 is formed on a non-conductive substrate 105 having a copper layer 108 on one side of its surface. The copper layer 108 has a typical thickness of 15 μm although copper layers 108 having a thickness which ranges from 3 to 35 μm are applicable to the method of the present invention. Especially suitable for manufacturing of high density interconnects are copper layers 108 having a thickness of 3-7 μm. Said copper layers 108 are often used with a thickness of 3 μm, 5 μm or 7 μm.

The at least one copper layer 108 which is attached to at least one surface of a non-conductive substrate 105 is structured i.e., converted to a circuitry by the print and etch method. Therefore, a photo resist layer 109 is deposited onto said copper layer 108 and patterned using methods known in the art. In one embodiment of the present invention, the surface of the copper layer 108 is treated with a micro etch process in order to enhance the adhesion between the surface of the copper layer 108 and the photo resist layer 109. Such micro etch processes for copper surfaces are described for example in W. Jillek, G. Keller "Handbuch der Leiterplattentechnik Band 4", E. G. Leuze Verlag Bad Saulgau, 1$^{st}$ Ed. 2003, p. 132. Typical micro etch processes comprise treatment of copper surfaces with persulfates and sulphuric acid or with a composition comprising hydrogen peroxide and sulphuric acid.

Optionally, the surface of the copper layer 108 is subjected to a mechanical treatment prior to the deposition of a photo resist to increase adhesion of a photo resist deposited later on onto the copper layer 108. Such mechanical treatments are known in the art and include brushing and pumicing.

Said chemical and mechanical procedures for increasing adhesion between the surface of a copper layer 108 and a photo resist layer can also be combined.

Either liquid and dry film photo resists can be applied in order to convert a copper layer 108 into a structured copper layer 108. Typical photo resist materials and procedures to deposit, illuminate and develop them are known in the art. In one embodiment of the present invention, a dry film photo resist is used to provide the circuitry pattern onto the copper layer 108. In another embodiment, a liquid photo resist is used for the same purpose as a dry film photo resist.

The copper layer 108 coated with a patterned photo resist is contacted with an etching composition to remove all copper from those parts of the copper layer 108 which are not coated with the photo resist, leading to a structured copper layer 108. For this purpose different etching compositions can be applied. In one embodiment, an acidic etching composition comprising an acid, a peroxide and $CuCl_2$ is used. In another embodiment, an alkaline etching composition comprising ammonia and $CuCl_2$ is used.

The photo resist layer 109 is removed from the non-conductive substrate 105 by conventional resist stripping methods wherein the resist coated substrate is contacted with an alkaline aqueous solution. The temperature of said stripping treatment is held typically between 50° C. and 55° C. Said aqueous solution is usually sprayed onto the non-conductive substrate 105 having a photo resist layer.

A solder mask layer 103 is deposited onto the structured copper layer 108 and the adjacent surface of the non-conducting substrate 105 after an opening 111 is formed. Both mechanical and laser drilling can be applied for this purpose. Laser drilling is the preferred method for the formation of an opening 111, a stacked blind micro via 113 and solder resist openings 107 having a diameter of ≦150 μm. Either UV type or $CO_2$ type laser drilling methods are applicable to the invention.

In one embodiment of the invention the solder mask layer 103 is a permanent solder mask and remains attached to the structured copper layer 108 and the surface of the non-conductive substrate 105 after manufacturing of the printed circuit board.

The solder mask layer 103 is deposited onto the surface of the non-conductive substrate 105 and the structured copper layer 108 by known techniques. Examples applicable to the present invention are screen printing and/or photo lithographic processes. Various types of solder masks can be used in accordance with the present invention: UV-hardening solder masks, thermal curable two-component solder masks and photo imageable solder masks.

In one embodiment of the invention shown in FIG. 14 openings 111 are drilled after deposition of the solder mask layer 103 contrary as shown in FIGS. 12 and 13, i.e., material of the non-conductive substrate 105 is removed by laser drilling after deposition and structuring of the solder mask layer 103.

In still another embodiment of the present invention a stacked blind micro via 113 is drilled through the solder mask layer 103 deposited before drilling and the non-conductive substrate 105 as shown in FIG. 15.

In the next step the drilled stacked blind micro via 113 and solder resist opening 107 which expose the inner layer contact pad 110 have to be cleaned and conditioned for subsequent process steps. Methods known in the art like desmear processes are applicable to the method of the present invention.

Smear is related to polymer material residues derived from non-conductive substrate material, solder mask and photo resist and is caused by drilling and effect of heat during drilling. The smear must be removed prior to metallization of said hole to archive a reliable adhesion of the first metallization layer and the dielectric material and/or to guarantee a reliable copper/copper interconnection.

Said smear can be removed for example by plasma techniques using tetra-fluoromethane or a nitrogen/oxygen mixture in a high electrical power field. Plasma techniques are especially applied for base materials like Teflon® and polyimide in a batch process mode.

In one embodiment of the present invention, the desmear process is an alkaline permanganate treatment wherein the plastic material smear from laser drilled opening 111, stacked blind micro via 113 and solder resist opening 107 is removed with a three step process comprising a) swelling of the plastic material in a e.g., butylglycol-based swelling agent, b) permanganate etching which leads to a removal of smear and other residues from plastic material and c) a reducing process wherein breakdown products generated during permanganate etching are removed and the substrate surface inside a hole is further cleaned and conditioned. Said reducing step c) is usually carried out with $H_2O_2$ based compositions. Optionally a further process step is added in order to clean glass particles and/or glass filaments present in some types of substrate materials.

Optionally, a barrier layer 102 is formed on the inner layer contact pad 110 (FIG. 13) prior to deposition of a conductive seed layer 101.

Next a solder material layer 100 containing tin or tin alloy is then formed on the conductive seed layer 101.

The solder deposit layer 100 as well as the conductive seed layer 101 is being removed from the solder mask layer 103.

Optionally, an additional layer of a metal is deposited onto the solder deposit layer 100 after excess solder material is etched away. The metal is deposited by an electroless metal plating process and is selected from the group consisting of lead, silver, copper, bismuth, antimony, zinc, nickel, aluminium, magnesium, indium, tellurium, gold and gallium. Said electroless metal plating process includes immersion plating and autocatalytic plating. Processes and compositions for electroless deposition of lead, silver, copper, bismuth, antimony, zinc, nickel, aluminium, magnesium, indium, tellurium and gallium are known in the art and can be adapted to the present invention without any further modification. The preferred metals for electroless metal plating onto the solder deposit layer 100 are silver, copper, nickel, gold and palladium. Said additional layer of metal deposited onto the solder deposit layer 100 forms an intermetallic alloy solder when subjected to a reflow process.

The following example further illustrates the present invention.

EXAMPLES

Example 1

An IC substrate is used having a contact pad structure according to FIG. 1a. The SRO is 120 µm, the solder mask height is 25 µm.

The plating sequence is according to FIG. 1. First a conductive seed layer 101 of copper is formed on the entire substrate surface. For this the surface is first contacted with an acidic solution containing ionogenic palladium and then with a solution for chemical copper deposition.

Thereafter, a tin solder deposit 100 is plated on the conductive layer from a bath containing:

45 g/L $Sn^{2+}$ as $Sn(MSA)_2$, 60 mL/L MSA (70% solution), 2 g/L Hydroquinone, 7.0 g/L of Lugalvan BNO12 and 100 mg/L benzal acetone.

The pH of the bath is 0, the temperature 25° C. Plating is for 7 min. Pulse plating is used applying the following parameters:

Average current density of the forward current pulse: 2 $A/dm^2$;

Duration of the forward current pulse: 20 ms;

Average current density of the reverse current pulse: 0 $A/dm^2$ (no reverse pulse, only pause pulse);

Duration of the reverse current pulse: 4 ms.

The openings (SRO) according to FIG. 1 are completely filled with tin solder deposit without any void formation. Additionally, tin has been deposited on the solder mask area 103, the thickness of which is 3 µm (FIG. 1c).

The tin solder deposit 100 on the solder mask area as well as the conductive seed layer 101 are thereafter removed by treatment in a solution containing 30 vol-% nitric acid at a temperature of 40° C. for 1 min.

After the etching process tin solder deposit 100 only remains in the opening, while the tin solder deposit 100 as well as the conductive seed layer of copper 101 on the solder mask area 103 have been entirely removed (FIG. 1d). The tin solder deposit shows a very homogenous surface distribution and is whisker free. It is suited to be soldered to a chip or circuit.

Example 2

Example 1 is repeated, now using a tin bath comprising 45 g/l $Sn^{2+}$ as $Sn(MSA)_2$, 60 ml/l MSA (70% solution), 0.5 g/l 2-amino-3-hydroxy-pyridin, 7.0 g/l of Lugalvan® BNO12 (a product of BASF SE) and a mixture of levelling agents consisting of 0.5 g/l methacrylic acid and 0.05 g/l 1-naphthaldehyde.

The tin solder deposit shows a very homogenous surface distribution and is whisker free. It is suited to be soldered to a chip or circuit.

The invention claimed is:

1. A method of forming a solder deposit on a substrate comprising the following steps:
   i) provide a substrate including a surface bearing electrical circuitry that includes at least one contact area,
   ii) form a solder mask layer that is placed on the substrate surface and patterned to expose the at least one contact area,
   ii a) form an additional resist layer on the solder mask layer,
   iii) contact the entire substrate area including the resist and solder mask layer and the at least one contact area with a solution suitable to provide a conductive layer on the substrate surface,
   iv) electroplate a solder deposit layer containing a tin or tin alloy onto the conductive layer,
   v) etch away an amount of the solder deposit layer containing tin or tin alloy and the conductive layer sufficient to remove both the solder deposit layer and the conductive layer from the resist layer area leaving a solder material layer on the at least one contact area,
   vi) remove the resist layer.

2. The method according to claim 1 comprising the following steps between step i) and step ii):
   a) form a photo resist layer that is placed on the at least one copper surface of the substrate and structure said photo resist layer to a negative image of a circuitry,
   b) etch away the portions of the at least one copper surface which are exposed through the patterned photo resist,
   c) remove the photo resist.

3. The method according to claim 1 wherein at least one opening to expose at least one inner layer pad is formed.

4. The method according to claim 3 wherein the at least one opening is formed after step ii).

5. The method according to claim 3 wherein the at least one opening is formed before step ii).

6. The method according to claim 1 wherein the tin or tin alloy is deposited from a composition comprising
   at least one source of tin ions
   at least one acid
   at least one leveling agent which is selected form the group consisting of aromatic aldehydes, aromatic ketones and α-/β-unsaturated carboxylic acids and
   at least one anti-oxidant.

7. The method according to claim 6 wherein the at least one aromatic aldehyde or ketone is selected from the group consisting of benzylidene acetone, benzaldehyde, 3-chlorobenzaldehyde, 4-chlorobenzaldehyde, 2,4-dichlorobenzaldehyde, 2,6-dichlorobenzaldehyde, 2,4,6-trichlorobenzaldehyde, 1-naphthaldehyde, 2-naphthaldehyde, 2-hydroxybenzaldehyde, 3-hydroxybenzaldehyde, 4-hydroxybenzaldehyde, 2-methylbenzaldehyde, 3-methylbenzaldehyde, 4-methylbenzaldehyde, m-anisaldehyde, o-anisaldehyde, p-anisaldehyde, 2-chloroacetophenone, 3-chloroacetophenone, 4-chloroacetophenone, 2,4-dichloroacetophenone, 2,4,6-trichloroacetophenone.

8. The method according to claim 6 wherein the at least one α-/β-unsaturated carboxylic acid is selected from the group consisting of acrylic acid, methacrylic acid, crotonic acid, 3-chloroacrylic acid, 3,3-dimethylacrylic acid, 2,3-dimethylacrylic acid, methyl acrylate, ethyl acrylate, n-butyl acrylate, i-butyl acrylate, 2-ethylhexyl acrylate, ethyl methacrylate, n-butyl methacrylate, i-butyl methacrylate, 2-hydroxyethyl methacrylate, 2-hydroxypropyl methacrylate, 2-dimethylaminoethyl methacrylate, methacrylic anhydride and methyl methacrylic acid.

9. The method according to claim 6 wherein a mixture of at least one aromatic aldehyde or aromatic ketone and at least one α-/β-unsaturated carboxylic acid is used as leveling agents.

10. The method according to claim 1 wherein a barrier layer is plated on the at least one contact area.

11. The method according to claim 10 wherein the barrier layer consists of a metal selected from the group consisting of copper, tin, nickel, chromium, titanium, gold, copper-chromium alloy, tin-lead alloy and any alloy thereof.

12. The method according to claim 1 wherein an additional layer of metal is deposited onto the solder deposit layer.

13. The method according to claim 12 wherein the additional layer of metal is selected from the group consisting of lead, silver, copper, bismuth, antimony, zinc, nickel, aluminum, magnesium, indium, tellurium, gold and gallium.

14. The method according to claim 1 wherein the contact area comprises a via or trench.

15. The method according to claim 1, wherein the substrate is subjected to a reflow process to reflow the solder deposit layer containing a tin or tin alloy.

16. The method according to claim 1 wherein the conductive seed layer is formed by electroless deposition of copper.

17. The method according to claim 1 wherein the solder deposit layer is a tin alloy made by the mixture of tin and the elements selected from the group consisting of lead, silver, copper, bismuth, antimony, zinc, nickel, aluminum, magnesium, indium, tellurium, nickel and gallium.

18. The method according to claim 1 wherein the substrate is a printed circuit board, an IC substrate or an interposer.

\* \* \* \* \*

UNITED STATES PATENT AND TRADEMARK OFFICE
CERTIFICATE OF CORRECTION

| | | |
|---|---|---|
| PATENT NO. | : 8,507,376 B2 | Page 1 of 1 |
| APPLICATION NO. | : 13/121471 | |
| DATED | : August 13, 2013 | |
| INVENTOR(S) | : Ewert et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b)(3) by 294 days.

Signed and Sealed this
Thirty-first Day of May, 2016

Michelle K. Lee
*Director of the United States Patent and Trademark Office*